(12) United States Patent
Lee

(10) Patent No.: US 8,278,127 B2
(45) Date of Patent: Oct. 2, 2012

(54) METHOD FOR MANUFACTURING A THIN-FILM TRANSISTOR USING A LASER

(75) Inventor: Hyung Sup Lee, Suwon-si (KR)

(73) Assignee: JS Lighting Co., Ltd. (KR)

( * ) Notice: Subject to any disclaimer, the term of this patent is extended or adjusted under 35 U.S.C. 154(b) by 0 days.

(21) Appl. No.: 13/056,970

(22) PCT Filed: Aug. 3, 2009

(86) PCT No.: PCT/KR2009/004320
§ 371 (c)(1),
(2), (4) Date: Jan. 31, 2011

(87) PCT Pub. No.: WO2010/013984
PCT Pub. Date: Feb. 4, 2010

(65) Prior Publication Data
US 2011/0136303 A1 Jun. 9, 2011

(30) Foreign Application Priority Data

Aug. 1, 2008 (KR) .................. 10-2008-0075640
Aug. 1, 2008 (KR) .................. 10-2008-0075652
Aug. 1, 2008 (KR) .................. 10-2008-0075669

(51) Int. Cl.
*H01L 21/336* (2006.01)

(52) U.S. Cl. ............ 438/30; 438/34; 438/149; 438/158; 438/E21.158

(58) Field of Classification Search .............. 438/30, 438/34, 149, 151–166; 257/59; 349/38, 349/42–43
See application file for complete search history.

(56) References Cited

U.S. PATENT DOCUMENTS 7,532,267 B2    5/2009    Chae et al.
(Continued)

FOREIGN PATENT DOCUMENTS

KR    10-0557499 B1    3/2006
(Continued)

OTHER PUBLICATIONS

Joon Youp Lee; "TFT Array Substrate and a Manufacturing Method Thereof for Solving a Problem that a Contrast Ratio is Deteriorated by Leakage Light Generated in a Contact Hole Area Even in a Black Screen"; Korean Patent Abstracts; Publication No. 1020080062647 A; Publication Date: Jul. 3, 2008; Korean Intellectual Property Office, Republic of Korea.

(Continued)

*Primary Examiner* — Dung A. Le
(74) *Attorney, Agent, or Firm* — The Law Offices of Andrew D. Fortney; Andrew D. Fortney; Bradley J. Levang

(57) ABSTRACT

A method and apparatus of fabricating a thin film transistor is disclosed, which patterns an ohmic contact layer by a laser patterning process so that it is capable of preventing a semiconductor layer from being damaged, and reducing fabrication time, wherein the method comprises forming a gate electrode pattern on a substrate; forming a gate insulating layer on the gate electrode pattern; sequentially forming a semiconductor layer pattern and an ohmic contact layer pattern on the gate insulating layer; forming source and drain electrode patterns on the ohmic contact layer pattern, wherein the source and drain electrode patterns are provided at a fixed interval therebetween; and removing the ohmic contact layer pattern exposed between the source and drain electrode patterns through the use of laser.

22 Claims, 24 Drawing Sheets

U.S. PATENT DOCUMENTS

| | | |
|---|---|---|
| 7,824,940 B2 | 11/2010 | Chae et al. |
| 2004/0125254 A1 | 7/2004 | Chae et al. |
| 2009/0233391 A1* | 9/2009 | Chae et al. .................. 438/30 |
| 2010/0136729 A1* | 6/2010 | Chae et al. .................. 438/30 |
| 2011/0062447 A1* | 3/2011 | Misaki ........................ 257/72 |

FOREIGN PATENT DOCUMENTS

| | | |
|---|---|---|
| KR | 10-2006-0108943 A | 10/2006 |
| KR | 10-2006-0108945 A | 10/2006 |
| KR | 10-2008-0062647 A | 7/2008 |

OTHER PUBLICATIONS

Taek Ahn, Min Chul Suh and Yeon Gon Mo; "Etching Method Using Laser Beam and Method for Manufacturing Thin Film Transistor Using the Same"; Korean Patent Abstracts; Publication No. 1020060108943 A; Publication Date: Oct. 18, 2006; Korean Intellectual Property Office, Republic of Korea.

Taek Ahn, Min Chul Suh and Jae Bon Koo; "Method for Manufacturing Thin Film Transistor (TFT) Using Laser Beam Irradiation and TFT Manufactured Thereby"; Korean Patent Abstracts; Publication No. 1020060108945 A; Publication Date: Oct. 18, 2006; Korean Intellectual Property Office, Republic of Korea.

Gi Seong Chae and Yong Seop Hwang; "Liquid Crystal Display and Method for Manufacturing the Same"; Korean Patent Abstracts; Publication No. 1020040062108 A (corresponding to Korean Patent No. 10-0557499); Publication Date: Jul. 7, 2004; Korean Intellectual Property Office, Republic of Korea.

International Search Report of International Searching Authority; International Application No. PCT/KR2009/004320, Dated Mar. 18, 2010; 5 pages; International Searching Authority/Korean Intellectual Property Office, Republic of Korea.

* cited by examiner

METHOD FOR MANUFACTURING A THIN-FILM TRANSISTOR USING A LASER

CROSS REFERENCE TO RELATED APPLICATIONS

This application claims the benefit of the Korean Patent Application Nos. P2008-0075640, P2008-0075652, and P2008-0075669 filed on Aug. 1, 2008, which are hereby incorporated by reference as if fully set forth herein.

BACKGROUND OF THE INVENTION

1. Field of the Invention

The present invention relates to a method and apparatus of fabricating a thin film transistor, and more particularly, to a method and apparatus of fabricating a thin film transistor, which patterns an ohmic contact layer by a laser patterning process so that it is capable of preventing a semiconductor layer from being damaged, and reducing fabrication time.

2. Discussion of the Related Art

Generally, a thin film transistor (hereinafter, referred to as "TFT") may be used as a switching device for controlling an operation of each pixel in a flat type display device such as a liquid crystal display device or a light-emitting display device; or may be used as a driving device for driving each pixel in the flat type display device.

The TFT includes a gate electrode, a semiconductor layer formed to be insulated from the gate electrode, source and drain electrodes formed to have a channel region on the semiconductor layer, and a pixel electrode formed to be electrically connected with the source or drain electrode.

In order to improve an electrical conductivity between a semiconductor layer pattern (a-Si) and source/drain electrodes for a related art process of fabricating TFT, an ohmic contact layer (n$^+$ a-Si) is additionally formed between the semiconductor layer pattern and the source/drain electrodes. In this case, if the ohmic contact layer is connected between the source and drain electrodes, the ohmic contact layer functions as a conductor, whereby the TFT is not driven. For the related art process of fabricating TFT, the ohmic contact layer positioned between the source and drain electrodes (which corresponds to a channel region of the TFT) is removed by a dry etching process after patterning the source and drain electrodes through a wet etching process. During the dry etching process, the source and drain electrodes serve as a mask for etching the ohmic contact layer.

However, the related art method of fabricating TFT has the following disadvantages.

Since the ohmic contact layer is selectively etched by the dry etching process, an inaccurate etching for the ohmic contact layer may cause a problem of over etching, whereby the semiconductor layer may be damaged due to the over etching.

Also, the damage to the semiconductor layer may lower the yield of TFT.

As the ohmic contact layer is selectively etched by the dry etching process, the increased fabrication time causes deterioration of productivity.

Since the pixel electrode is electrically connected with the source electrode by photolithography, the fabrication process is complicated and the fabrication time is increased, thereby lowering the yield.

SUMMARY OF THE INVENTION

Accordingly, the present invention is directed to a method and apparatus of fabricating TFT that substantially obviates one or more problems due to limitations and disadvantages of the related art.

An aspect of the present invention is to provide a method and apparatus of fabricating TFT, which patterns an ohmic contact layer by a laser patterning process so that it is capable of preventing a semiconductor layer from being damaged, and reducing fabrication time.

Another aspect of the present invention is to provide a method and apparatus of fabricating TFT, which is capable of simplifying a process of fabricating a TFT array substrate, and preventing a semiconductor layer from being damaged.

Another aspect of the present invention is to provide a method and apparatus of fabricating TFT, which is capable of simplifying a process of patterning a thin film, and reducing patterning time.

Additional features and aspects of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a method of fabricating TFT comprises forming a gate electrode pattern on a substrate; forming a gate insulating layer on the gate electrode pattern; sequentially forming a semiconductor layer pattern and an ohmic contact layer pattern on the gate insulating layer; forming source and drain electrode patterns on the ohmic contact layer pattern, wherein the source and drain electrode patterns are provided at a fixed interval therebetween; and removing the ohmic contact layer pattern exposed between the source and drain electrode patterns through the use of laser.

The process of removing the ohmic contact layer pattern through the use of laser comprises a step of applying laser with a gradually-decreased laser power to the ohmic contact layer pattern exposed between the source and drain electrode patterns.

The process of forming the gate electrode pattern comprises forming a gate electrode material on an entire surface of the substrate; and forming a predetermined gate electrode pattern by removing a predetermined portion of the gate electrode material through the use of laser.

The process of forming the semiconductor layer pattern and the ohmic contact layer pattern comprises sequentially forming a semiconductor layer material and an ohmic contact layer material on an entire surface of the gate insulating layer; and forming a predetermined semiconductor layer pattern and a predetermined ohmic contact layer pattern by removing predetermined portions of the semiconductor layer material and ohmic contact layer material through the use of laser.

The process of forming the source and drain electrode patterns comprises forming source and drain electrode materials on the entire surface of the substrate including the ohmic contact layer pattern; and forming a predetermined source electrode pattern and a predetermined drain electrode pattern by removing predetermined portions of the source and drain electrode materials through the use of laser.

The method further comprises forming a passivation layer on the entire surface of the substrate including the source and drain electrode patterns; and forming a pixel electrode pattern electrically connected with the source electrode pattern.

The process of forming the passivation layer comprises a step of forming a contact hole in the passivation layer so as to electrically connect the pixel electrode pattern with the source electrode pattern; and wherein the process of forming the pixel electrode pattern comprises steps of forming a pixel electrode material on the entire surface of the substrate including the passivation layer with the contact hole, and forming a predetermined pixel electrode pattern by removing a predetermined portion of the pixel electrode material through the use of laser.

The process of forming the pixel electrode pattern comprises forming a pixel electrode pattern on the passivation layer; and applying laser to the pixel electrode pattern so as to electrically connect the pixel electrode pattern with the source electrode pattern.

In another aspect of the present invention, a method of fabricating TFT comprises forming a gate electrode pattern on a substrate; forming a gate insulating layer on the gate electrode pattern; forming a semiconductor layer pattern on the gate insulating layer; forming source and drain electrode patterns on the semiconductor layer pattern, wherein the source and drain electrode patterns are provided at a fixed interval therebetween; forming a passivation layer on the source and drain electrode patterns; and forming a pixel electrode pattern electrically connected with the source electrode pattern, wherein at least one of the aforementioned processes for forming the gate electrode pattern, the semiconductor layer pattern, the source and drain electrode patterns, and the pixel electrode pattern is performed by steps of forming a corresponding material on an entire surface of the substrate, and removing a predetermined portion of the corresponding material from the substrate through the use of laser.

The method further comprises forming a gate pad electrode pattern simultaneously with the gate electrode pattern; forming a data pad electrode pattern simultaneously with the source and drain electrode patterns; and forming gate and data pad patterns simultaneously with the pixel electrode pattern.

The process of removing the predetermined portion of the corresponding material through the use of laser is performed by removing the corresponding material from a first region of the substrate through the use of a first laser with a first width, and simultaneously removing the corresponding material from a second region except the first region of the substrate through the use of a second laser with a second width, wherein the second width is wider than the first width.

The process of forming the pixel electrode pattern comprises forming a pixel electrode pattern on the passivation layer; and applying laser to the pixel electrode pattern so as to electrically connect the pixel electrode pattern with the source electrode pattern.

The process of forming the pixel electrode pattern, the gate pad electrode pattern, and the data pad electrode pattern comprises forming a pixel electrode pattern, a gate pad pattern, and a data pad pattern on the passivation layer; performing a first electrical-connection process for electrically connecting the pixel electrode pattern with the source electrode pattern by applying laser to the pixel electrode pattern; performing a second electrical-connection process for electrically connecting the gate pad electrode pattern with the gate pad pattern by applying laser to the gate pad pattern; and performing a third electrical-connection process for electrically connecting the data pad electrode pattern with the data pad pattern by applying laser to the data pad pattern.

At least two of the first electrical-connection process, the second electrical-connection process, and the third electrical-connection process are performed at the same time.

In another aspect of the present invention, a method of fabricating TFT comprises forming a gate electrode pattern on a substrate; forming a gate insulating layer on the gate electrode pattern; forming a semiconductor layer pattern on the gate insulating layer; forming source and drain electrode patterns on the semiconductor layer pattern, wherein the source and drain electrode patterns are provided at a fixed interval therebetween; forming a passivation layer on an entire surface of the substrate including the source and drain electrode patterns; forming a pixel electrode pattern on the passivation layer; and performing an electrical-connection process for electrically connecting the pixel electrode pattern with the source electrode pattern by applying laser to the pixel electrode pattern.

The method further comprises forming a gate pad electrode pattern simultaneously with the gate electrode pattern; forming a data pad electrode pattern simultaneously with the source and drain electrode patterns; forming gate and data pad patterns simultaneously with the pixel electrode pattern; performing an electrical-connection process for electrically connecting the gate pad electrode pattern with the gate pad pattern by applying laser to the gate pad pattern; and additionally performing an electrical-connection process for electrically connecting the data pad electrode pattern with the data pad pattern by applying laser to the data pad pattern.

In another aspect of the present invention, an apparatus of fabricating TFT comprises an array processing part for forming a predetermined layer on a substrate; and a laser processing part for forming a predetermined pattern by applying laser to the substrate, wherein the laser processing part comprises a base frame; a stage on which a substrate is loaded, the stage installed in the base frame; a gantry positioned in the base frame; and a laser irradiation apparatus, installed in the gantry, for forming the predetermined pattern on the substrate by applying laser to the substrate loaded on the stage.

At this time, the gantry comprises a first gantry installed at each of both edges of the base frame; and at least one second gantry installed in the first gantry, wherein the second gantry moves in a first horizontal direction by an operation of the first gantry, and also moves the laser irradiation apparatus in a second horizontal direction perpendicular to the first horizontal direction.

The laser processing part comprises an ohmic contact layer pattern forming part for forming a predetermined shape of an ohmic contact layer pattern by removing a predetermined portion of the ohmic contact layer pattern exposed between source and drain electrode patterns positioned with a fixed interval therebetween.

The laser processing part comprises a gate electrode pattern forming part for forming a gate electrode pattern by using a gate material; a semiconductor layer and ohmic contact layer pattern forming part for forming a semiconductor layer pattern and an ohmic contact layer pattern by using a semiconductor material and an ohmic contact material; source and drain electrode pattern forming part for forming the source and drain electrode patterns by using source and drain materials; and a pixel electrode pattern forming part for forming a pixel electrode pattern by using a pixel electrode material.

The laser processing part comprises an electrical-connection processing part for electrically connecting first and second conductive layers which are insulated with a passivation layer interposed therebetween.

The electrical-connection process comprises a first electrical-connection process for electrically connecting a pixel electrode pattern and a source electrode pattern insulated with a passivation layer interposed therebetween; a second electrical-connection process for electrically connecting a gate pad pattern and a gate pad electrode pattern insulated with a passivation layer interposed therebetween; and a third electrical-connection process for electrically connecting a data pad pattern and a data pad electrode patter insulated with a passivation layer interposed therebetween.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method and apparatus of fabricating TFT according to the present invention will be described with reference to the accompanying drawings.

FIGS. 1A to 1H are cross section views illustrating a method of fabricating TFT according to the embodiment of the present invention.

Figure 1A:
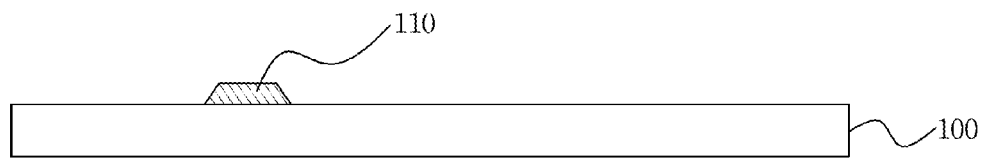
FIGS. 1A to 1H are cross section views illustrating a method of fabricating TFT according to the embodiment of the present invention.

First, as shown in FIG. 1A, a gate electrode pattern 110 is formed on a substrate 100. In this case, the substrate 100 may be made of a transparent material, for example, glass or plastic such as PET (Polyethylene Terephthalate), PEN (Polyethylenenaphthelate), PP (Polypropylene), PI (Polyamide) or TAC (Tri Acetyl Cellulose). Preferably, the substrate 100 is made of glass, but not necessarily.

The gate electrode pattern 110 may be formed in a single-layered structure or multi-layered structure by using at least one of metal materials such as copper (Cu), copper alloy (Cu Alloy), aluminum (Al), aluminum neodymium (AlNd), molybdenum (Mo), molybdenum alloy, chrome (Cr), chrome alloy, titanium (Ti), titanium alloy, argentums (Ag) and argentums alloy. In this case, the gate electrode pattern 110 may be formed by steps of forming the metal material on an entire surface of the substrate 100 through a metal-material deposition process such as sputtering; and patterning the metal material by photolithography. Selectively, the gate electrode pattern 110 may be formed only by a printing process without performing the metal-material deposition process such as sputtering.

Figure 1B:
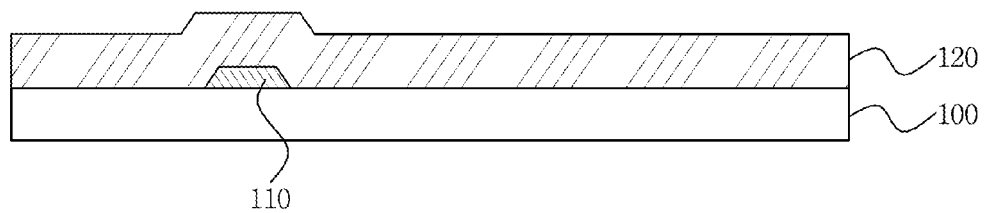

As shown in FIG. 1B, a gate insulating layer 120 is formed on the entire surface of the substrate 100 including the gate electrode pattern 110. The gate insulating layer 120 may be made of an inorganic material, for example, silicon nitride (SiNx) or silicon oxide (SiOx).

Figure 1C:
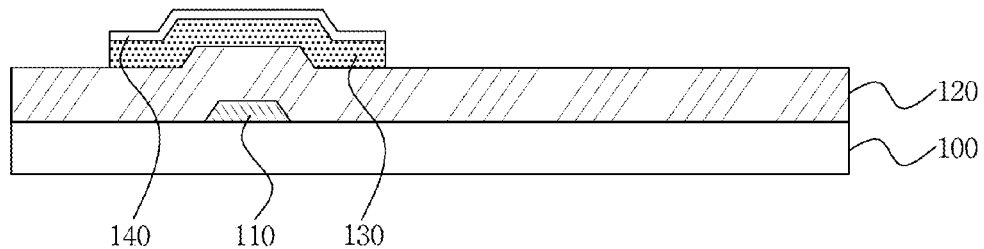

As shown in FIG. 1C, a semiconductor layer pattern 130 and an ohmic contact layer pattern 140 are sequentially formed on the gate insulating layer 120 only above the gate electrode pattern 110. In this case, the semiconductor layer pattern 130 and the ohmic contact layer pattern 140 may be formed on an entire surface of the gate insulating layer 120 by PECVD (Plasma Enhanced Chemical Vapor Deposition), and then may be patterned sequentially or simultaneously.

Figure 1D:
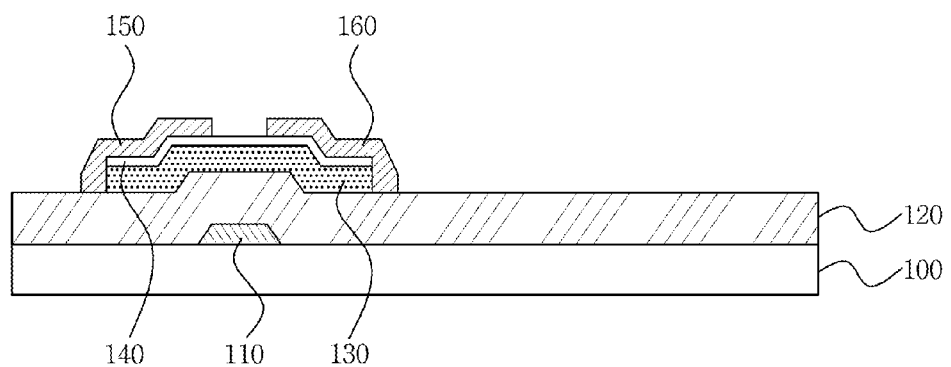

As shown in FIG. 1D, source and drain electrode patterns 160 and 150 are formed on the ohmic contact layer 140 while maintaining a predetermined interval therebetween, wherein the source and drain electrode patterns 160 and 150 are provided to be in contact with the semiconductor layer pattern 130 and the ohmic contact layer pattern 140. At this time, the source and drain electrode patterns 160 and 150 may be made of any one of metal materials, for example, molybdenum (Mo), nickel (Ni), chrome (Cr), and tungsten (W). At this time, the source and drain electrode patterns 160 and 150 may be formed by sequential steps of forming the metal material on the entire surface of the substrate 100 through a metal-material deposition process such as sputtering, and patterning the metal material by photolithography. Selectively, the source and drain electrode patterns 160 and 150 may be respectively formed only by a printing process.

Figure 1E:
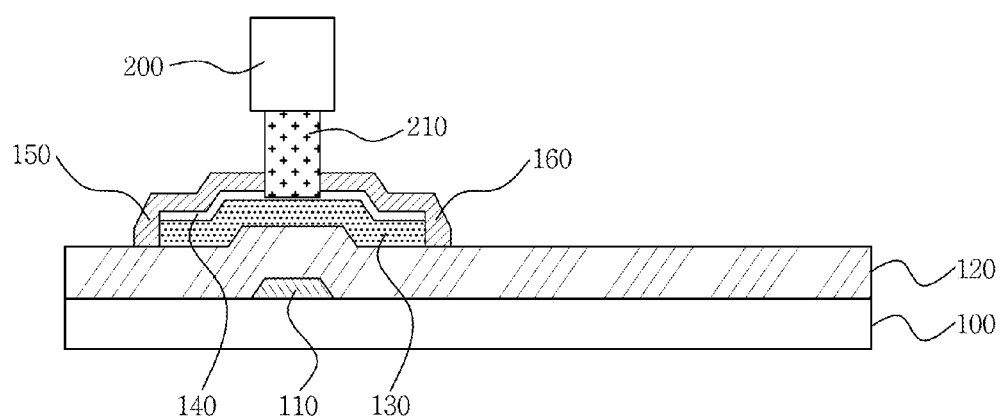

As shown in FIG. 1E, a predetermined portion of the ohmic contact layer pattern 140, which is exposed in a channel region (CH) of TFT between the source electrode pattern 160 and the drain electrode pattern 150, is irradiated at least once with laser 210 emitted from a laser irradiation apparatus 200, thereby removing only the predetermined portion of the ohmic contact layer pattern 140 exposed between the source electrode pattern 160 and the drain electrode pattern 150. At this time, since selectivity of the laser 210 is such great as to selectively remove a singular layer according to power, only the predetermined portion of the ohmic contact layer pattern 140 can be removed without damage to the semiconductor layer pattern 130. The laser 210 may use YLF laser which includes Nd3+ in addition to YLiF4 (YLF) crystal using a solid-phase material as a medium; Nd:YAG laser having infrared wavelength of 1064 nm; or H-F laser corresponding to Excimer laser using a gaseous medium.

In order to prevent the semiconductor layer pattern 130 from being damaged when removing the ohmic contact layer pattern 140, the laser irradiation apparatus 200 applies the laser 210, whose power is gradually decreased as approaching to the semiconductor layer pattern 130, to the ohmic contact layer pattern 140 several times, to thereby remove only the predetermined portion of the ohmic contact layer pattern 140 exposed between the source electrode pattern 160 and the drain electrode pattern 150.

Figure 1F:
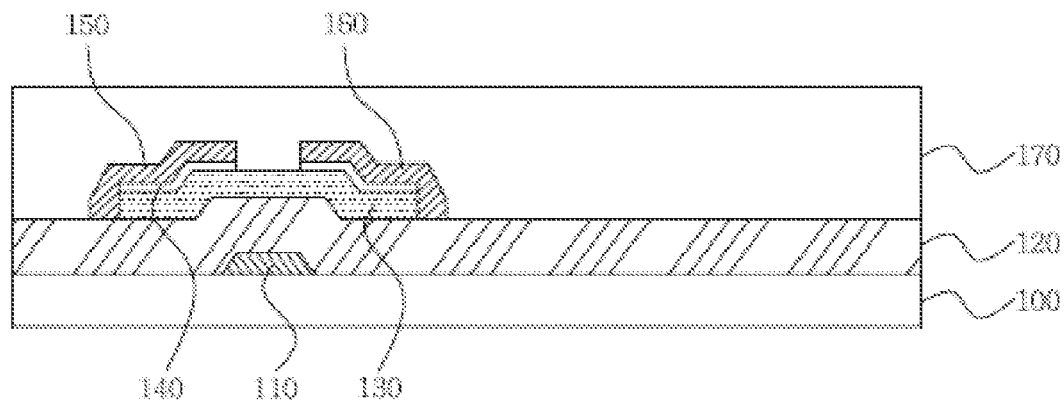

As shown in FIG. 1F, a passivation layer 170 is formed on the entire surface of the substrate 100 including the source electrode pattern 160 and the drain electrode pattern 150. At this time, the passivation layer 170 may be formed of any one of silicon nitride (SiNx), silicon oxide (SiOx), BCB (Benzo-CycloButene), and acrylic resin.

Figure 1G:
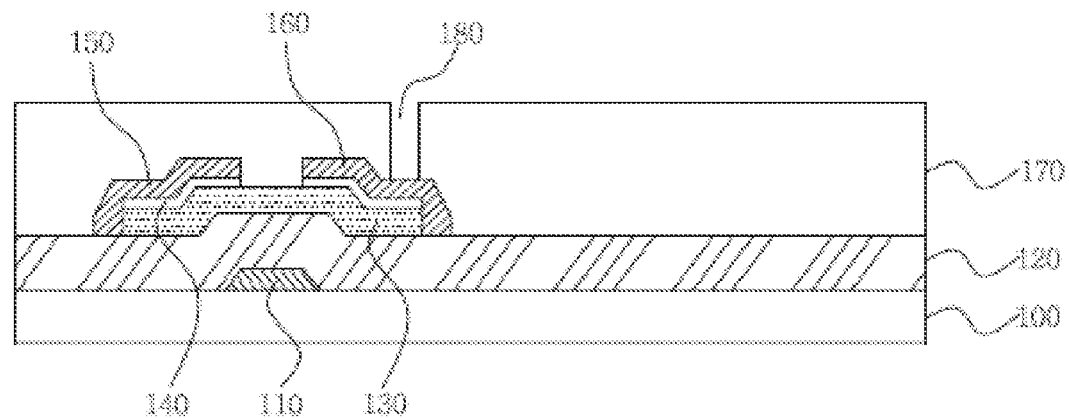

As shown in FIG. 1G, a contact hole 180 is formed in the passivation layer 170, wherein the contact hole 180 exposes a predetermined portion of the source electrode pattern 160. The contact hole 180 may be formed by photolithography.

Figure 1H:
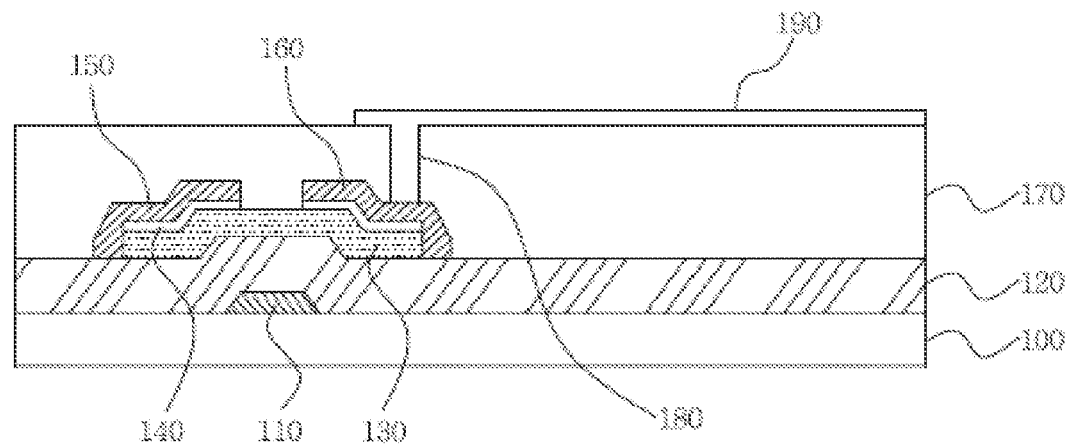

As shown in FIG. 1H, a pixel electrode pattern 190 is formed on the passivation layer 170, wherein the pixel electrode pattern 190 is electrically connected with the source electrode pattern 160 through the contact hole 180. The pixel electrode pattern 190 may be made of a transparent conductive material, for example, ITO (Indium Tin Oxide), IZO (Indium Zinc Oxide), AZO, or ZnO. At this time, the pixel electrode pattern 190 may be formed on the entire surface of the substrate 100 including the passivation layer 170, and then may be patterned by photolithography.

The aforementioned method of fabricating TFT according to the present invention removes only the predetermined portion of the ohmic contact layer pattern 140 exposed between the source electrode pattern 160 and the drain electrode pattern 150 by using the laser 210, to thereby prevent the semiconductor layer pattern 130 from being damaged for the process of removing the ohmic contact layer pattern 140. Accordingly, the method of fabricating TFT according to the present invention can prevent the yield from being lowered due to the damage to the semiconductor layer pattern 130, and also can reduce the fabrication time.

Figure 2:
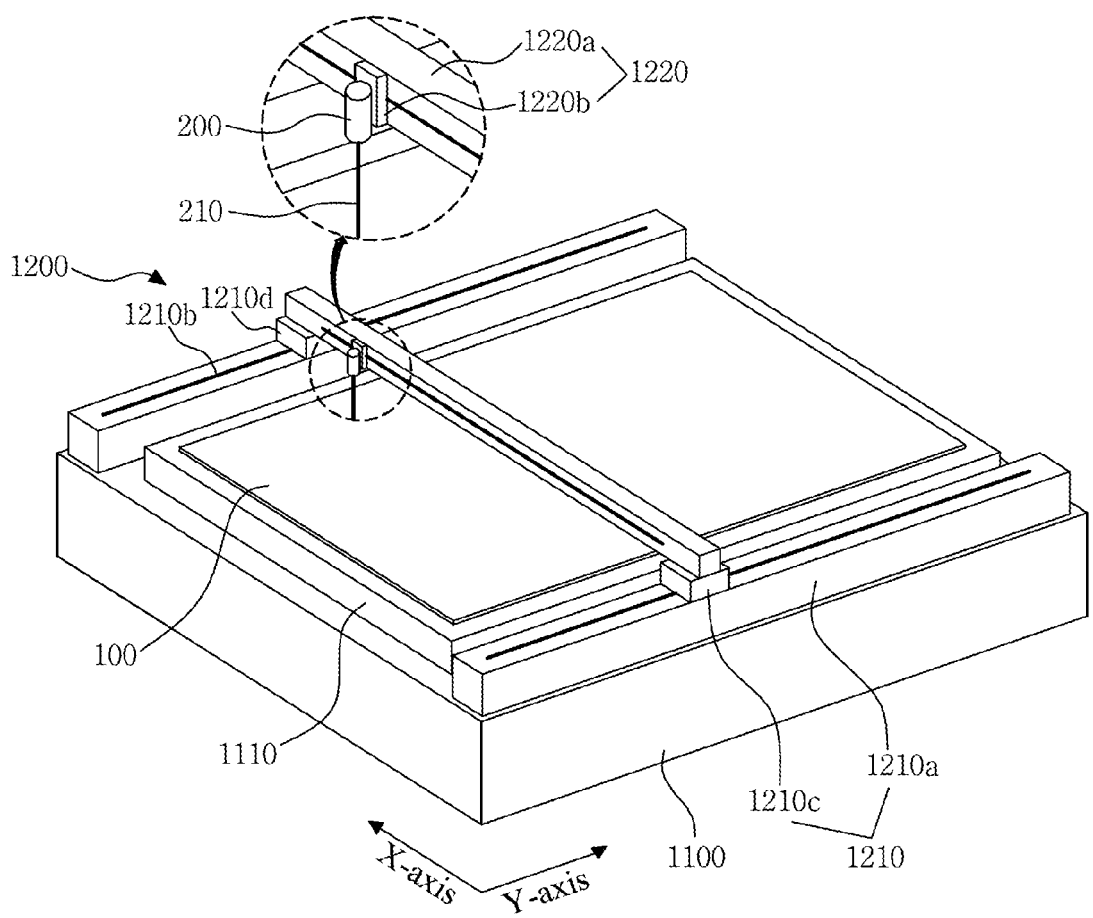
FIG. 2 is a perspective view illustrating an apparatus of fabricating TFT according to the first embodiment of the present invention.

FIG. 2 is a perspective view illustrating an apparatus of fabricating TFT according to the first embodiment of the present invention.

Referring to FIG. 2, the apparatus of fabricating TFT according the first embodiment of the present invention includes a base frame 1100, a stage 1110, a gantry 1200, and a laser irradiation apparatus 200.

The base frame 1100 supports the stage 1110. Inside the base frame 1100, there may be a driving/controlling apparatus (not shown) which drives and controls the stage 1110, the gantry 1200, and the laser irradiation apparatus 200, respectively.

The substrate 100 is transferred by an external substrate-transfer (not shown), and the transferred substrate 100 is loaded on the stage 1110. At this time, the external substrate-transfer (not shown) loads the substrate 100 which completes cleaning and drying processes after forming the source and drain electrode patterns 160 and 150 by the aforementioned steps of FIG. 1(A to D), onto the stage 1110.

The stage 1110 may comprise an additionally-provided lift pin (not shown) for loading or unloading the substrate 100, and also comprise a plurality of vacuum pads (not shown) for a vacuum suction of the loaded substrate 100. Also, the stage 1110 may be moved in the X-axis and Y-axis directions by the driving/controlling apparatus (not shown).

The gantry 1200 comprises a first gantry 1210 installed on the base frame 1100; and a second gantry 1220, installed in the first gantry 1210, for moving the laser irradiation apparatus 200 in the X-axis direction.

The first gantry 1210 moves the second gantry 1220 in the Y-axis direction through the use of LM guide or linear motor. For this, the first gantry 1210 may comprise a pair of first guiders 1210a and 1210b and a pair of first sliders 1210c and 1210d, wherein the pair of first guiders 1210a and 1210b are respectively installed in parallel at both edges of the base frame 1100, and the pair of first sliders 1210c and 1210d are respectively installed in the first guiders 1210a and 1210b.

The second gantry 1220 moves in the Y-axis direction according to the operation of the first gantry 1210, and also moves the laser irradiation apparatus 200 in the X-axis direction through the use of LM guide or linear motor. For this, the second gantry 1220 may comprise a second guider 1220a connected between the pair of first sliders 1210c and 1210d of the first gantry 1210, and a second slider 1220b installed in the second guider 1220a.

The laser irradiation apparatus 200 is installed in the second slider 1220b. The laser irradiation apparatus 200 moves in the Y-axis direction according as the pair of first sliders 1210c and 1210d are moved by the operation of the first gantry 1210, and the laser irradiation apparatus 200 also moves in the X-axis direction according as the second slider 1220b is moved by the operation of the second gantry 1220. While the laser irradiation apparatus 200 is moved in the X-axis and Y-axis directions by the operation of the gantry 1200, the laser irradiation apparatus 200 directly applies the laser 210 to the substrate 100, thereby patterning the predetermined portion of the ohmic contact layer pattern 140 exposed between the source electrode pattern 160 and the drain electrode pattern 150, as shown in FIG. 1E. At this time, the laser 210 may use YLF laser which includes Nd3+ in addition to YLiF4 (YLF) crystal using a solid-phase material as a medium; Nd:YAG laser having infrared wavelength of 1064 nm; or H-F laser corresponding to Excimer laser using a gaseous medium.

In order to prevent the semiconductor layer pattern 130 from being damaged when removing the ohmic contact layer pattern 140, the laser irradiation apparatus 200 applies the laser 210, whose power is gradually decreased as approaching to the semiconductor layer pattern 130, to the ohmic contact layer pattern 140 several times, to thereby remove the ohmic contact layer pattern 140.

The apparatus of fabricating TFT according to the first embodiment of the present invention patterns only the ohmic contact layer on the substrate 100 by applying the laser 210 while the laser irradiation apparatus 200 is moved through the use of gantry 1200, whereby it is possible to prevent the semiconductor layer from being damaged, and to reduce the fabrication time.

The apparatus for fabricating TFT according to the first embodiment of the present invention discloses the movable laser irradiation apparatus 200. However, it is not limited to this structure. For example, under such circumstance that the laser irradiation apparatus 200 is provided fixedly, only the stage 1110 may be moved to pattern the ohmic contact layer pattern 140. Also, both the laser irradiation apparatus 200 and the stage 1110 may be simultaneously moved to pattern the ohmic contact layer pattern 140.

Figure 3:
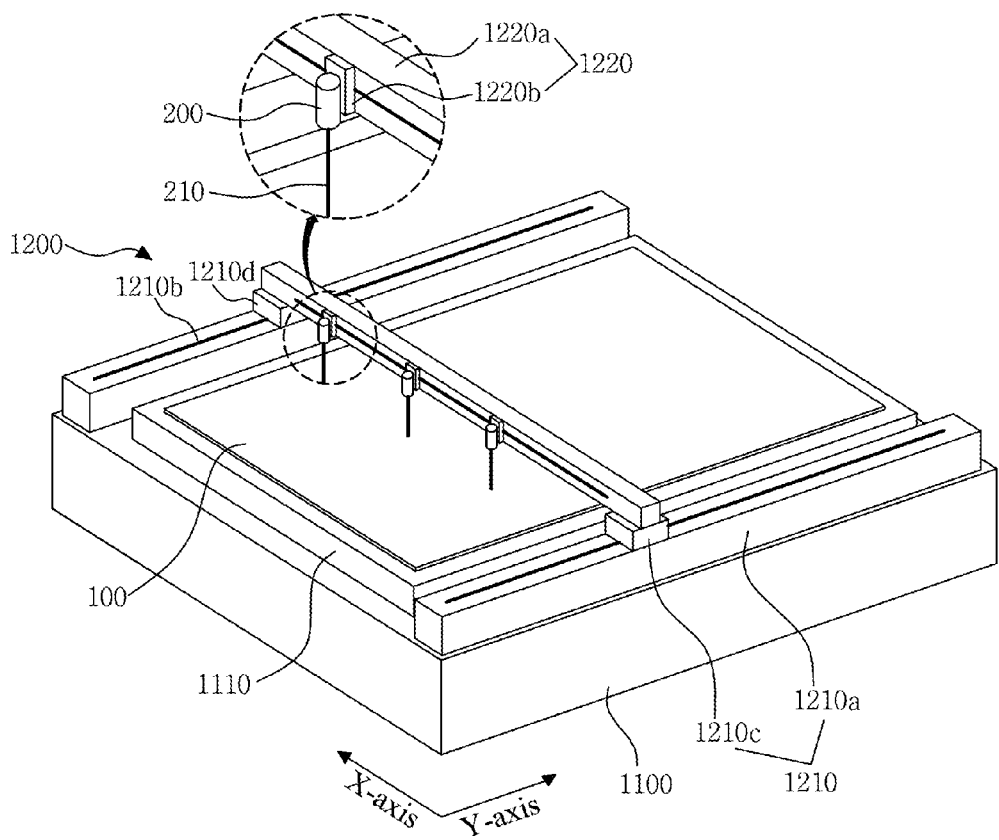
FIG. 3 is a perspective view illustrating an apparatus of fabricating TFT according to the second embodiment of the present invention.

FIG. 3 is a perspective view illustrating an apparatus of fabricating TFT according to the second embodiment of the present invention.

Referring to FIG. 3, the apparatus of fabricating TFT according to the second embodiment of the present invention includes a base frame 1100, a stage 1110, a gantry 1200, and a plurality of laser irradiation apparatuses 200. Except that the apparatus of fabricating TFT according to the second embodiment of the present invention is provided with the plurality of laser irradiation apparatuses 200 in the gantry 1200 so as to reduce fabrication time, the apparatus of fabricating TFT according to the second embodiment of the present invention is identical in structure to the apparatus of fabricating TFT according to the first embodiment of the present invention. Thus, an explanation will be provided only concerning different structures from those of the first embodiment of the present invention, that is, the aforementioned explanation for the same structures can substitute for the detailed explanation for the structures of the apparatus according to the second embodiment of the present invention.

For providing the plurality of laser irradiation apparatuses 200, the gantry 1200 includes a plurality of second sliders 1220b installed in a second guider 1220a and provided at fixed intervals. The plurality of second sliders 1220b are moved in the X-axis direction through the use of LM guide or linear motor.

The plurality of laser irradiation apparatuses 200 are respectively installed in the plurality of second sliders 1220b. That is, the plurality of laser irradiation apparatuses 200 apply laser 210 to divided regions of the substrate 100 while the plurality of laser irradiation apparatuses 200 positioned at fixed intervals are moved by the movement of the second sliders 1220b respectively installed in the corresponding laser irradiation apparatuses 200, to thereby pattern only ohmic contact layer of the substrate 100. In this case, the substrate 100 may be divided into at least two regions according to the number of laser irradiation apparatuses 200. Accordingly, the plurality of laser irradiation apparatuses 200 are respectively installed above the corresponding divided-regions so as to pattern only the ohmic contact layer formed in the corresponding divided-region.

The apparatus of fabricating TFT according to the second embodiment of the present invention patterns only the ohmic contact layer on the substrate 100 by applying the laser 210 emitted from the plurality of laser irradiation apparatuses 200 which are moved through the use of gantry 1200, whereby it is possible to prevent the semiconductor layer from being damaged, and to reduce the fabrication time.

The apparatus for fabricating TFT according to the second embodiment of the present invention discloses the plurality of laser irradiation apparatuses 200 provided movably. However, it is not limited to this structure. For example, under such circumstance that the plurality of laser irradiation apparatuses 200 are provided fixedly, only the stage 1110 may be moved to pattern the ohmic contact layer pattern 140. Also, both the plurality of laser irradiation apparatuses 200 and the stage 1110 may be simultaneously moved to pattern the ohmic contact layer pattern 140.

Figure 4:
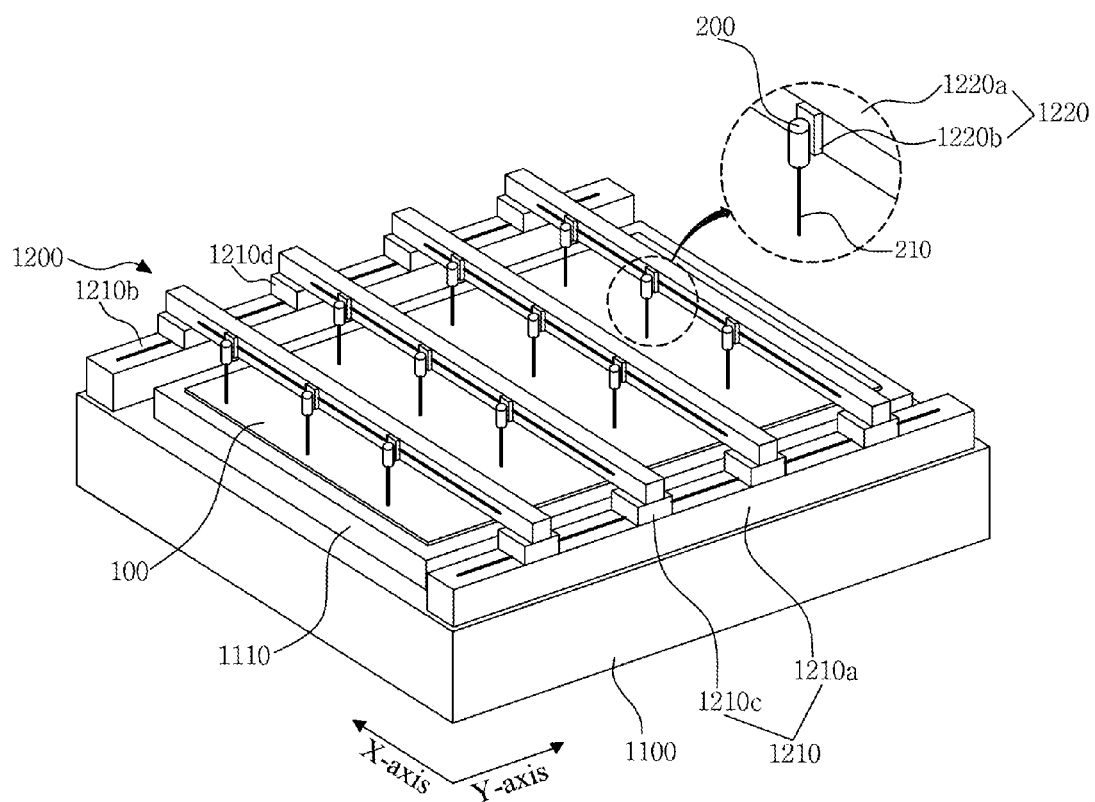
FIG. 4 is a perspective view illustrating an apparatus of fabricating TFT according to the third embodiment of the present invention.

FIG. 4 illustrates an apparatus of fabricating TFT according to the third embodiment of the present invention.

Referring to FIG. 4, the apparatus of fabricating TFT according to the third embodiment of the present invention is provided with a plurality of laser irradiation apparatuses 200 arranged along the Y-axis direction and the X-axis direction to reduce fabrication time. Thus, an explanation will be provided only concerning different structures from those of the first embodiment of the present invention, that is, the aforementioned explanation for the same structures can substitute for the detailed explanation for the structures of the apparatus according to the third embodiment of the present invention.

A gantry 1200 may comprise a first gantry 1210 installed on a base frame 1100; and a plurality of second gantries 1220, installed in the first gantry 1210 and provided at fixed intervals, for moving the plurality of laser irradiation apparatuses 200 in the X-axis direction.

The first gantry 1210 moves the second gantry 1220 in the Y-axis direction through the use of LM guide or linear motor. For this, the first gantry 1210 may comprise a pair of first guiders 1210a and 1210b and a pair of first sliders 1210c and 1210d, wherein the pair of first guiders 1210a and 1210b are respectively installed in parallel at both edges of the base frame 1100, and the pair of first sliders 1210c and 1210d are respectively installed in the first guiders 1210a and 1210b.

The plurality of second gantries 1220 move in the Y-axis direction according to the operation of the first gantry 1210, and also move the plurality of laser irradiation apparatuses 200 in the X-axis direction through the use of LM guide or linear motor. For this, the plurality of second gantries 1220 may comprise a plurality of second guiders 1220a installed between the pair of first sliders 1210c and 1210d; and a plurality of second sliders 1220b provided at fixed intervals and installed in the respective second guiders 1220a.

The plurality of laser irradiation apparatuses 200 are respectively installed in the plurality of second sliders 1220b. The plurality of laser irradiation apparatuses 200 move in the Y-axis direction according as the pair of first sliders 1210c and 1210d are moved by the operation of the first gantry 1210; and move in the X-axis direction according as the second slider 1220b is moved by the operation of the second gantry 1220. While the plurality of laser irradiation apparatus 200 are moved at fixed intervals in the X-axis and Y-axis directions according to the operation of the gantry 1200, laser 210 emitted from the plurality of laser irradiation apparatuses 200 is applied to divided-regions of a substrate 100, to thereby pattern only ohmic contact layer on the substrate 100. At this time, the substrate 100 may be divided into at least nine regions according to the number of laser irradiation apparatuses 200. Accordingly, the plurality of laser irradiation apparatuses 200 are respectively installed above the corresponding divided-regions so as to pattern only the ohmic contact layer formed in the corresponding divided-region.

In case of the apparatus of fabricating TFT according to the second embodiment of the present invention, while that the plurality of laser irradiation apparatuses 200 are moved through the use of gantry 1200, the laser 210 emitted from the plurality of laser irradiation apparatuses 200 is applied to the substrate 100, whereby only the ohmic contact layer is patterned on the substrate 100, thereby preventing a semiconductor layer from being damaged and reducing fabrication time.

The apparatus of fabricating TFT according to the third embodiment of the present invention discloses the plurality of laser irradiation apparatuses 200 provided movably. However, it is not limited to this structure. For example, only stage 1110 may be moved under such circumstance that the laser irradiation apparatuses 200 is provided fixedly; or the laser irradiation apparatuses 200 and the stage 1110 may be moved simultaneously, to thereby pattern only the ohmic contact layer.

Figure 5:
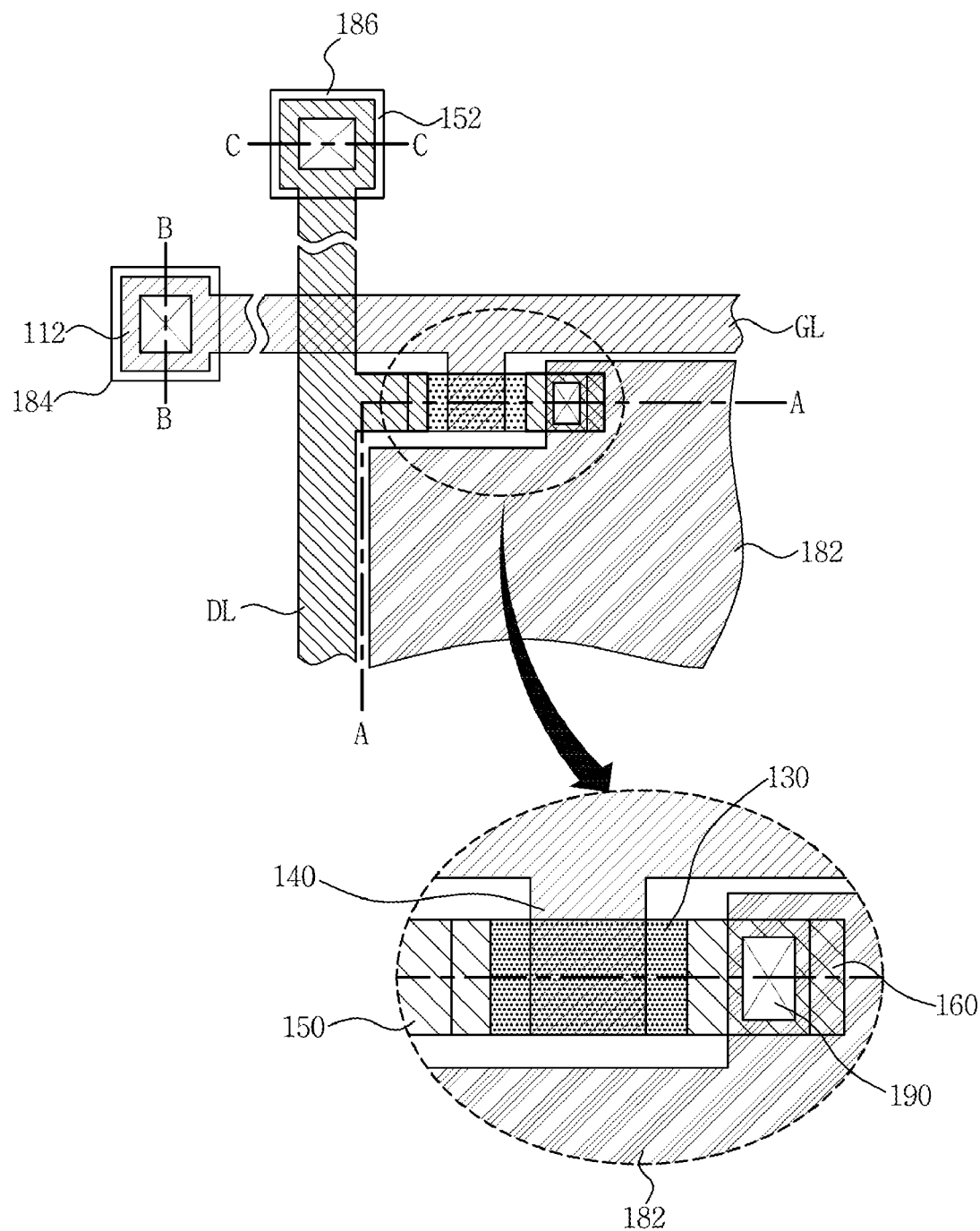
FIG. 5 is a plan view illustrating a TFT array substrate according to the embodiment of the present invention.

FIG. 5 is a plan view illustrating a TFT array substrate according to the embodiment of the present invention. FIGS.

6A to 6L are cross section views illustrating a method of fabricating TFT array substrate according to the embodiment of the present invention.

A method of fabricating TFT array substrate according to the embodiment of the present invention will be explained with reference to FIGS. 6A to 6L in conjunction with FIG. 5.

First, a substrate 100 includes a TFT region (A-A) on which a TFT is formed; a gate pad region (B-B) on which a gate pad electrode pattern 112 is formed for supplying a gate signal to the TFT through a gate line (GL); and a data pad region (C-C) on which a data pad electrode pattern 152 is formed for supplying a data signal to the TFT through a data line (DL).

Figure 6A:
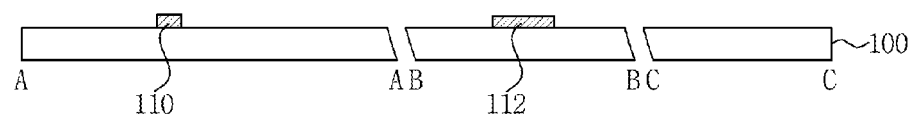
FIGS. 6A to 6L are cross section views illustrating a method of fabricating TFT array substrate according to the embodiment of the present invention.

As shown in FIG. 5 and FIG. 6A, the gate line (GL), the gate electrode pattern 110, and the gate pad electrode pattern 112 are formed on the TFT region (A-A) and the gate pad region (B-B) of the substrate 100. At this time, the substrate 100 may be made of a transparent material, for example, glass or plastic such as PET (Polyethylene Terephthalate), PEN (Polyethylenenaphthelate), PP (Polypropylene), PI (Polyamide) or TAC (Tri Acetyl Cellulose). Preferably, the substrate 100 is made of glass, but not necessarily.

The gate electrode pattern 110 may be formed in a single-layered structure or multi-layered structure by using at least one of metal materials such as copper (Cu), copper alloy (Cu Alloy), aluminum (Al), aluminum neodymium (AlNd), molybdenum (Mo), molybdenum alloy, chrome (Cr), chrome alloy, titanium (Ti), titanium alloy, argentums (Ag) and argentums alloy. In this case, the gate line (GL), the gate electrode pattern 110, and the gate pad electrode pattern 112 may be formed by steps of depositing the metal material on an entire surface of the substrate 100 by a metal-material deposition process such as sputtering, and patterning the deposited metal material by photolithography. Selectively, the gate line (GL), the gate electrode pattern 110, and the gate pad electrode pattern 112 may be formed only by printing without performing the metal-material deposition process such as sputtering.

Accordingly, the gate line (GL) is formed in a first direction of the substrate 100; the gate electrode pattern 110 extends from gate line (GL); and the gate pad electrode pattern 112 is connected with one end of the gate line (GL).

Figure 6B:
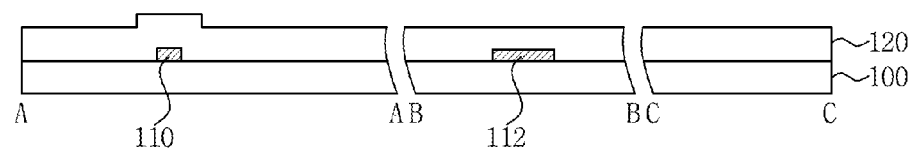

Then, as shown in FIG. 6B, a gate insulating layer 120 is formed on the entire surface of the substrate 100 including the gate line (GL), the gate electrode pattern 110, the gate pad electrode pattern 112. At this time, the gate insulating layer 120 may be made of an inorganic material, for example, silicon nitride (SiNx) or silicon oxide (SiOx).

Figure 6C:
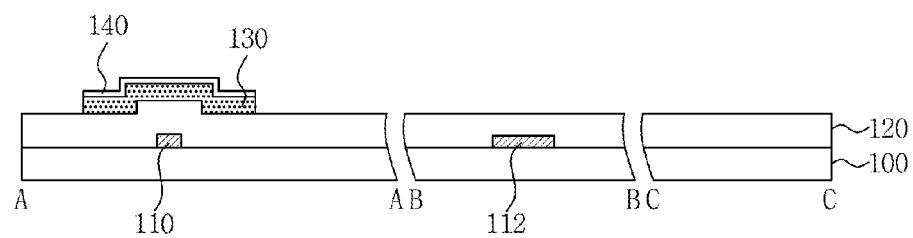

As shown in FIG. 5 and FIG. 6C, a semiconductor layer pattern 130 and an ohmic contact layer pattern 140 are sequentially on the gate insulating layer 120 above the gate electrode pattern 110. At this time, the semiconductor layer pattern 130 and the ohmic contact layer pattern 140 may be formed on an entire surface of the gate insulating layer 120 by PECVD (Plasma Enhanced Chemical Vapor Deposition), and then patterned simultaneously by photolithography.

Figure 6D:
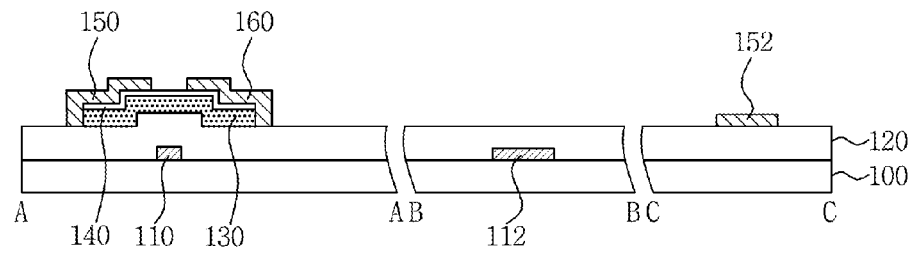

As shown in FIG. 5 and FIG. 6D, source and drain electrode patterns 160 and 150 are formed on the ohmic contact layer 140 while maintaining a predetermined interval therebetween, wherein the source and drain electrode patterns 160 and 150 are provided to be in contact with the semiconductor layer pattern 130 and the ohmic contact layer pattern 140. When forming the source and drain electrode patterns 160 and 150, the data line (DL) and the data pad electrode pattern 152 are formed simultaneously. In this case, the data line (DL), the source electrode pattern 160, the drain electrode pattern 150, and the data pad electrode pattern 152 may be made of any one of metal materials, for example, molybdenum (Mo), nickel (Ni), chrome (Cr), and tungsten (W). At this time, the data line (DL), the source electrode pattern 160, the drain electrode pattern 150, and the data pad electrode pattern 152 may be formed by sequential steps of forming the metal material on the entire surface of the substrate 100 by sputtering, and patterning the metal material layer by photolithography. Selectively, the data line (DL), the source electrode pattern 160, the drain electrode pattern 150, and the data pad electrode pattern 152 may be formed only by a printing process.

Figure 6E:
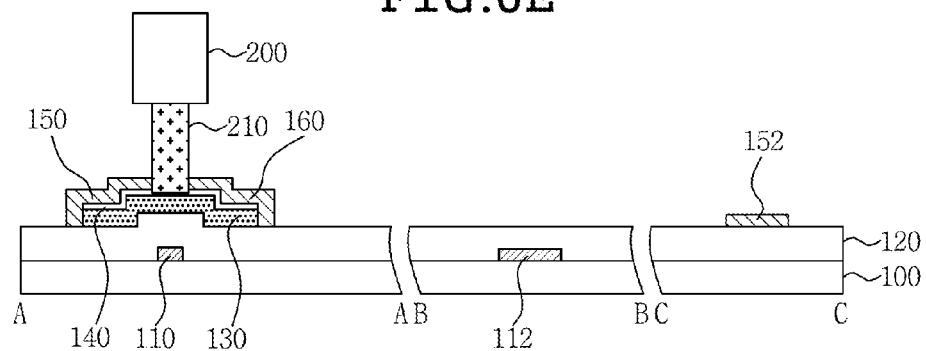
Figure 6F:
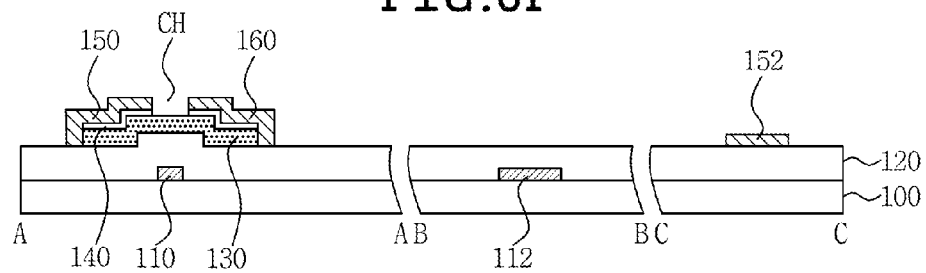

As shown in FIG. 6E, a predetermined portion of the ohmic contact layer pattern 140, which is exposed in a channel region (CH) of TFT between the source electrode pattern 160 and the drain electrode pattern 150, is irradiated at least once with first laser 210. Thus, only the predetermined portion of the ohmic contact layer pattern 140 exposed in the channel region (CH) between the source electrode pattern 160 and the drain electrode pattern 150 is removed as shown in FIG. 6F. At this time, since selectivity of the first laser 210 is such great as to selectively remove a singular layer according to power, only the predetermined portion of the ohmic contact layer pattern 140 can be removed without damage to the semiconductor layer pattern 130. At this time, the first laser 210 may use YLF laser which includes Nd3+ in addition to YLiF4 (YLF) crystal using a solid-phase material as a medium; Nd:YAG laser having infrared wavelength of 1064 nm; or H-F laser corresponding to Excimer laser using a gaseous medium.

In order to prevent the semiconductor layer pattern 130 from being damaged when removing the ohmic contact layer pattern 140, the first laser irradiation apparatus 200 directly applies the first laser 210, whose power is gradually decreased as approaching to the semiconductor layer pattern 130, to the ohmic contact layer pattern 140 several times, to thereby remove only the ohmic contact layer pattern 140.

Figure 6G:
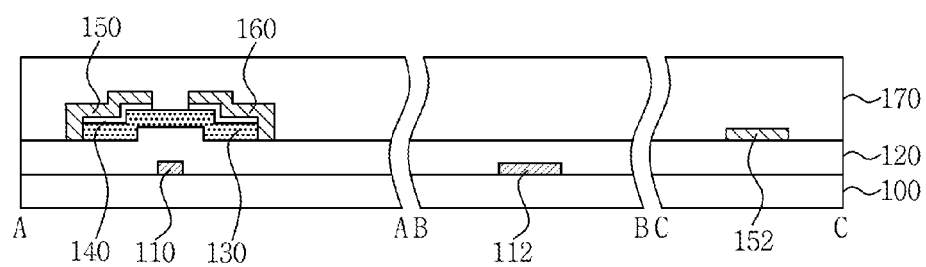

As shown in FIG. 6G, a passivation layer 170 is formed on the entire surface of the substrate 100 including the source electrode pattern 160 and the drain electrode pattern 150. At this time, the passivation layer 170 may be made of any one of silicon nitride (SiNx), silicon oxide (SiOx), BCB (BenzoCycloButene), and acrylic resin.

Figure 6H:
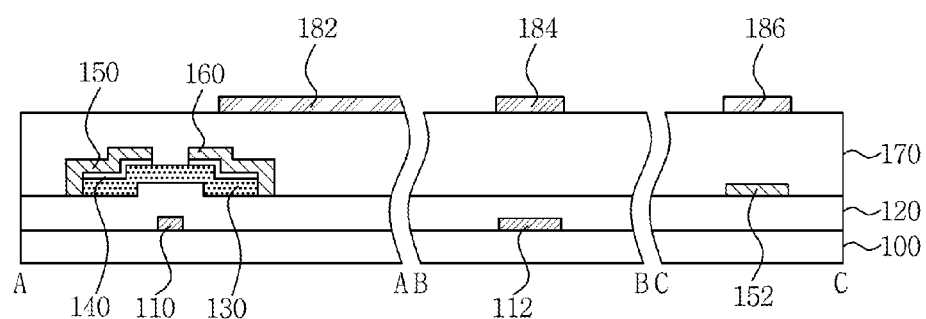

As shown in FIG. 5 and FIG. 6H, a transparent conductive material is formed on the passivation layer 170, and is then patterned by photolithography, to thereby form a pixel electrode pattern 182, a gate pad pattern 184, and a data pad pattern 186. At this time, the transparent conductive material may be ITO (Indium Tin Oxide), IZO (Indium Zinc Oxide), AZO, or ZnO.

Figure 6I:
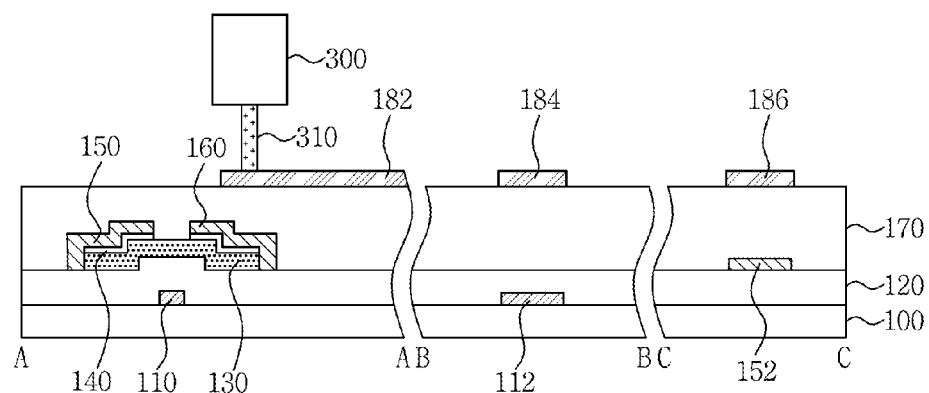

As shown in FIG. 6I, a second laser irradiation apparatus 300 is positioned above a predetermined portion of the pixel electrode pattern 182, wherein the predetermined portion of the pixel electrode pattern 182 overlaps with the source electrode pattern 160. Then, the pixel electrode pattern 182 is directly irradiated with second laser 310 with a first width emitted from the second laser irradiation apparatus 300.

Figure 6J:
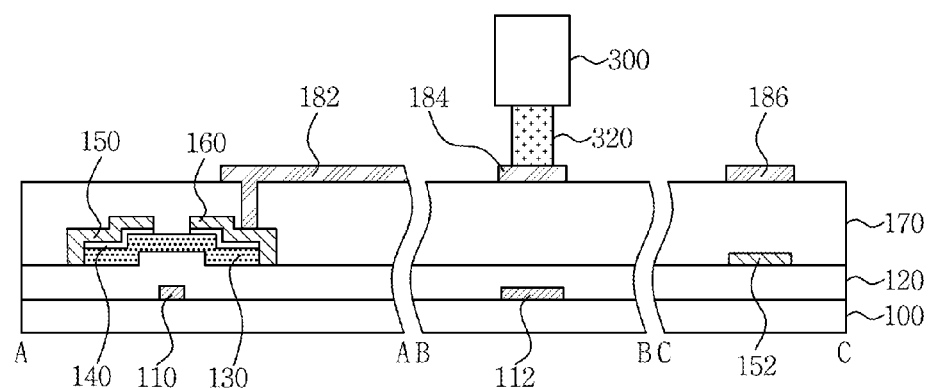

Accordingly, predetermined portions of the passivation layer 170 and the pixel electrode pattern 182, which are positioned above the source electrode pattern 160, are etched by a light energy of the second laser 310, whereby the pixel electrode pattern 182 is electrically connected with the source electrode pattern 160 through a contact hole 190 formed in the passivation layer 170, as shown in FIG. 6J. At this time, when the predetermined portion of the pixel electrode pattern 182 is directly irradiated with the second laser 310 with the first width, the pixel electrode pattern 182 provided in the predetermined portion of the passivation layer 170 is formed with the vertical sidewalls. However, if the pixel electrode pattern 182 is irradiated with the second laser 310 with the gradually-decreased first width, the pixel electrode pattern 182 provided in the predetermined portion of the passivation layer 170 is formed with inclined sidewalls.

As shown in FIG. 6J, the second laser irradiation apparatus 300 is positioned above a predetermined portion of the gate pad pattern 184, wherein the predetermined portion of the gate pad pattern 184 overlaps with the gate pad electrode pattern 112. Then, the predetermined portion of the gate pad pattern 184 is directly irradiated with third laser 320 with a second width emitted from the second laser irradiation apparatus 300. In this case, the second width may be the same as or wider than the first width.

Figure 6K:
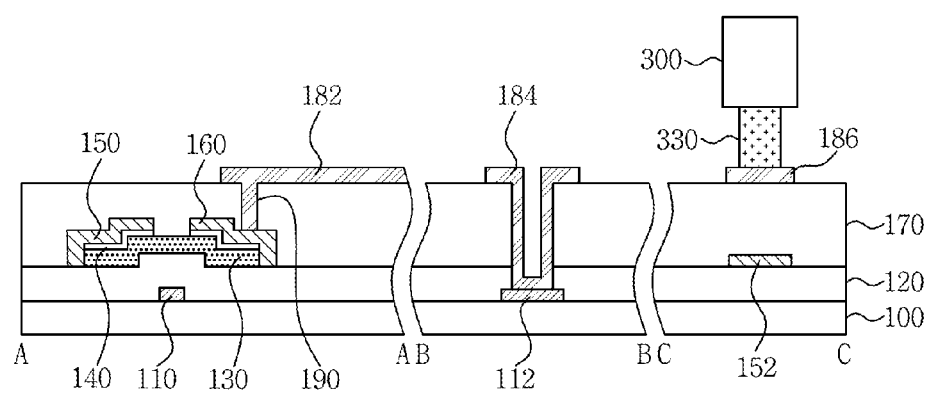

Accordingly, predetermined portions of the passivation layer 170 and the gate pad pattern 184, which are positioned above the gate pad electrode pattern 112, are etched by a light energy of the third laser 320, whereby the gate pad pattern 184 is electrically connected with the gate pad electrode pattern 112, as shown in FIG. 6K. At this time, when the predetermined portion of the gate pad pattern 184 is directly irradiated with the third laser 320 with the second width, the gate pad pattern 184 provided in the predetermined portion of the passivation layer 170 is formed with the vertical sidewalls. However, if the gate pad pattern 184 is irradiated with the third laser 320 with the gradually-decreased second width, the gate pad pattern 184 provided in the predetermined portion of the passivation layer 170 is formed with inclined sidewalls.

To increase a contact area between the gate pad electrode pattern 112 and the gate pad pattern 184, the gate pad pattern 184 is irradiated at fixed intervals with the third laser 320 several times, thereby forming a plurality of contact portions between the gate pad pattern 184 and the gate pad electrode pattern 112.

As shown in FIG. 6K, the second laser irradiation apparatus 300 is positioned above a predetermined portion of the data pad pattern 186, wherein the predetermined portion of the data pad pattern 186 overlaps with the data pad electrode pattern 152. Then, the second laser irradiation apparatus 300 directly applies fourth laser 330 with a third width to the data pad pattern 186. At this time, the third width may be a predetermined width between the first width and the second width, or may be the same as or wider than the second width.

Figure 6L:
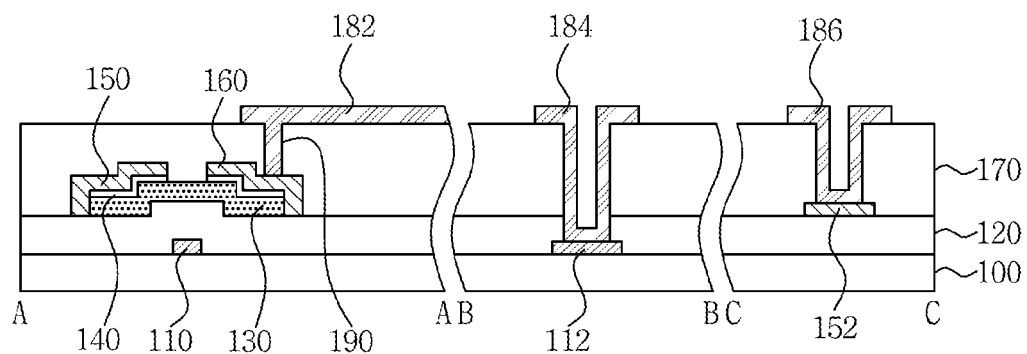

Accordingly, predetermined portions of the passivation layer 170 and the data pad pattern 186, which are positioned above the data pad electrode pattern 152, are etched by a light energy of the fourth laser 330, whereby the data pad pattern 186 is electrically connected with the data pad electrode pattern 152, as shown in FIG. 6L. At this time, when the predetermined portion of the data pad pattern 186 is directly irradiated with the fourth laser 330 with the third width, the data pad pattern 186 provided in the predetermined portion of the passivation layer 170 is formed with the vertical sidewalls. However, if the data pad pattern 186 is irradiated with the fourth laser 330 with the gradually-decreased third width, the data pad pattern 186 provided in the predetermined portion of the passivation layer 170 is formed with inclined sidewalls.

To increase a contact area between the data pad electrode pattern 152 and the data pad pattern 186, the data pad pattern 186 is irradiated at fixed intervals with the fourth laser 330 several times, thereby forming a plurality of contact portions between the data pad pattern 186 and the data pad electrode pattern 152.

Only the ohmic contact layer pattern 140 positioned between the source electrode pattern 160 and the drain electrode pattern 150 is removed by using the first laser 210 so that it is possible to prevent the semiconductor layer pattern 130 from being damaged during the process of removing the ohmic contact layer pattern 140. In addition, the respective electrical connections between the source electrode pattern 160 and the pixel electrode pattern 182, between the gate pad electrode pattern 112 and the gate pad pattern 184, and between the data pad electrode pattern 152 and the data pad pattern 186 are performed by using the second, third, and fourth laser 310, 320, and 330, which enables to simplify the fabrication process and to reduce the fabrication time.

As a result, it is possible to prevent the yield from being lowered by the damage to the semiconductor layer pattern 130, and also to reduce the fabrication time by simplifying the process of fabricating TFT array substrate.

The aforementioned fabrication method according to the present invention sequentially performs the first electrical-connection process for electrically connecting the source electrode pattern 160 with the pixel electrode pattern 182, the second electrical-connection process for electrically connecting the gate pad electrode pattern 112 with the gate pad pattern 184, and the third electrical-connection process for electrically connecting the data pad electrode pattern 152 with the data pad pattern 186. However, it is not limited to this. Selectively, these electrical-connection steps may vary within the range which is capable of reducing the fabrication time as shown in FIG. 7A, FIG. 7B, and FIG. 8.

Figure 7A:
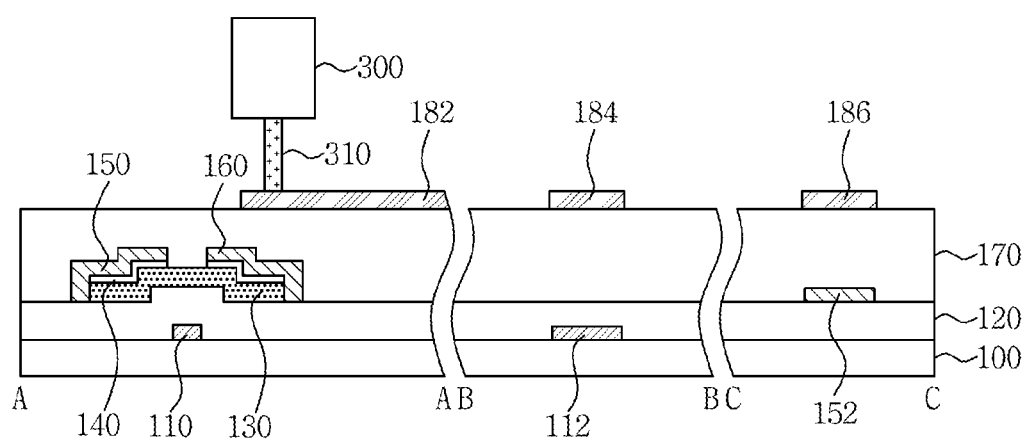
FIGS. 7A and 7B are cross section views explaining first to third electrical-connection processes according to another embodiment of the present invention.
Figure 7B:
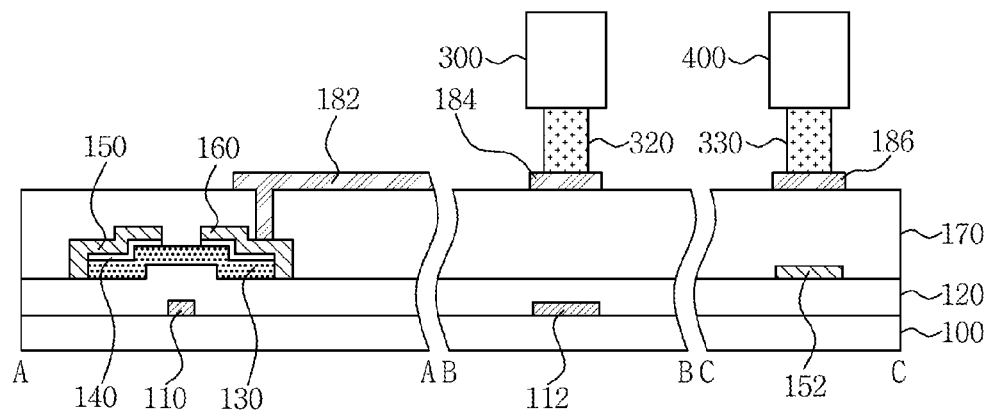

In case of the fabrication method according to one embodiment of the present invention, as shown in FIG. 7A, the first electrical-connection process is firstly performed by irradiating the pixel electrode pattern 182 with the second laser 310 through the use of second laser irradiation apparatus 300. Thereafter, as shown in FIG. 7B, the gate pad pattern 184 is irradiated with the third laser 320 through a use of second laser irradiation apparatus 300, and simultaneously the data pad pattern 186 is irradiated with the fourth laser 330 through the use of third laser irradiation apparatus 400, that is, the second and third electrical-connection processes are performed at the same time.

Figure 8:
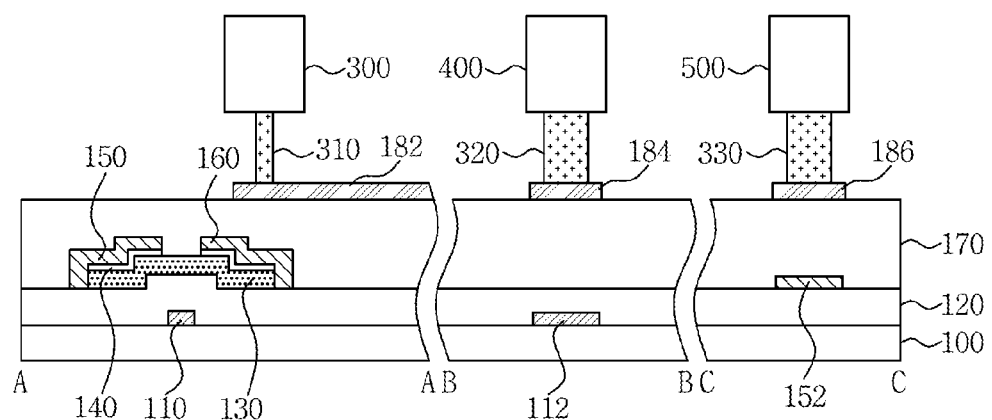
FIG. 8 is a cross section view explaining first to third electrical-connection processes according to another embodiment of the present invention.

In case of the fabrication method according to another embodiment of the present invention, as shown in FIG. 8, the pixel electrode pattern 182 is irradiated with the second laser 310 through the use of second laser irradiation apparatus 300; the gate pad pattern 184 is irradiated with the third laser 320 through the use of third laser irradiation apparatus 400; and simultaneously the data pad pattern 186 is irradiated with the fourth laser 330 through a use of fourth laser irradiation apparatus 500, whereby the first to third electrical-connection processes are performed at the same time.

Figure 9:
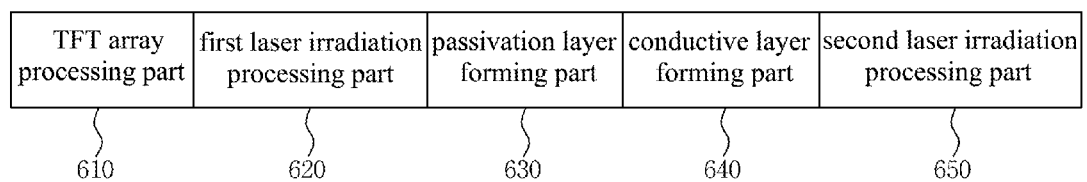
FIG. 9 is a block diagram explaining an apparatus of fabricating TFT according to the embodiment of the present invention.

FIG. 9 is a block diagram illustrating an apparatus of fabricating TFT array substrate according to the embodiment of the present invention.

Referring to FIG. 9 in conjunction with FIGS. 6A to 6L, the apparatus of fabricating TFT array substrate according to the embodiment of the present invention includes a TFT array processing part 610, a first laser irradiation processing part 620, a passivation layer forming part 630, a conductive layer forming part 640, and a second laser irradiation processing part 650.

Through the aforementioned process of FIGS. 6A to 6D, the TFT array processing part 610 forms the gate electrode pattern 110, the semiconductor layer pattern 130, the ohmic contact layer pattern 140, the source electrode pattern 160, and the drain electrode pattern 150 on the TFT region (A-A) of the substrate 100; forms the gate pad electrode pattern 112, which is connected with the gate electrode pattern 110 through the gate line (GL), on the gate pad region (B-B) of the substrate 100; and forms the data pad electrode pattern 152, which is connected with the drain electrode pattern 150 through the data line (DL), on the data pad region (C-C) of the substrate 100.

The first laser irradiation processing part 620 removes the predetermined portion of the ohmic contact layer pattern 140, which is exposed between the source electrode pattern 160 and the drain electrode pattern 150, by applying the first laser 210 thereto, as shown in FIG. 6E.

Figure 10:
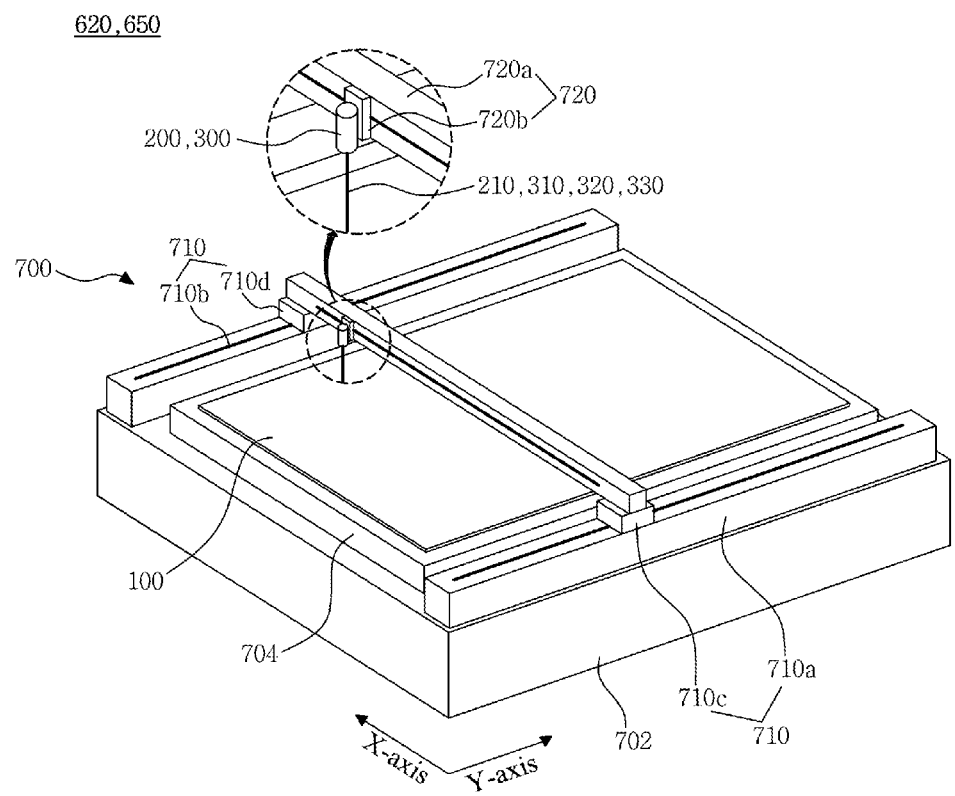
FIG. 10 is a perspective view illustrating first and second laser processing parts, shown in FIG. 9, according to the first embodiment of the present invention.

For this, as shown in FIG. 10, the first laser irradiation processing part 620 according to the first embodiment of the present invention includes a base frame 702, a stage 704, a gantry 700, and the first laser irradiation apparatus 200.

The base frame 702 supports the stage 704. Inside the base frame 702, there may be a driving/controlling apparatus (not shown) which drives and controls the stage 704, the gantry 700, and the first laser irradiation apparatus 200, respectively.

The substrate 100 is transferred by an external substrate-transfer (not shown), and the transferred substrate 100 is loaded on the stage 704. At this time, the external substrate-transfer (not shown) loads the substrate 100, which completes cleaning and drying processes after forming the source and drain electrode patterns 160 and 150 by the aforementioned steps of FIGS. 6A to 6D, onto the stage 704.

The stage 704 may include an additionally-provided lift pin (not shown) for loading or unloading the substrate 100, and also include a plurality of vacuum pads (not shown) for a vacuum suction of the loaded substrate 100. Also, the stage 704 may be moved in the X-axis and Y-axis directions by the driving/controlling apparatus (not shown).

The gantry 700 includes a first gantry 710 installed on the base frame 702; and a second gantry 720, installed in the first gantry 710, for moving the first laser irradiation apparatus 200 in the X-axis direction.

The first gantry 710 moves the second gantry 720 in the Y-axis direction through the use of LM guide or linear motor. For this, the first gantry 710 may comprise a pair of first guiders 710a and 710b and a pair of first sliders 710c and 710d, wherein the pair of first guiders 710a and 710b are respectively installed in parallel at both edges of the base frame 702, and the pair of first sliders 710c and 710d are respectively installed in the first guiders 710a and 710b.

The second gantry 720 moves in the Y-axis direction according to the operation of the first gantry 710, and also moves the first laser irradiation apparatus 200 in the X-axis direction through the use of LM guide or linear motor. For this, the second gantry 720 may comprise a second guider 720a connected between the pair of first sliders 710c and 710d, and a second slider 720b installed in the second guider 720a.

The first laser irradiation apparatus 200 is installed in the second slider 720b. The first laser irradiation apparatus 200 moves in the Y-axis direction according as the pair of first sliders 710c and 710d are moved by the operation of the first gantry 710, and the first laser irradiation apparatus 200 also moves in the X-axis direction according as the second slider 720b is moved by the operation of the second gantry 720.

While the first laser irradiation apparatus 200 is moved in the X-axis and Y-axis directions by the operation of the gantry 700, the laser irradiation apparatus 200 directly applies the first laser 210 to the substrate 100, thereby patterning the predetermined portion of the ohmic contact layer pattern 140 exposed between the source electrode pattern 160 and the drain electrode pattern 150, as shown in FIG. 6E.

The aforementioned first laser irradiation processing part 620 according to the first embodiment of the present invention discloses the movable first laser irradiation apparatus 200. However, it is not limited to this structure. For example, only the stage 704 may be moved under such circumstance that the first laser irradiation apparatus 200 is provided fixedly; or both the first laser irradiation apparatus 200 and the stage 704 may be moved simultaneously.

Figure 11:
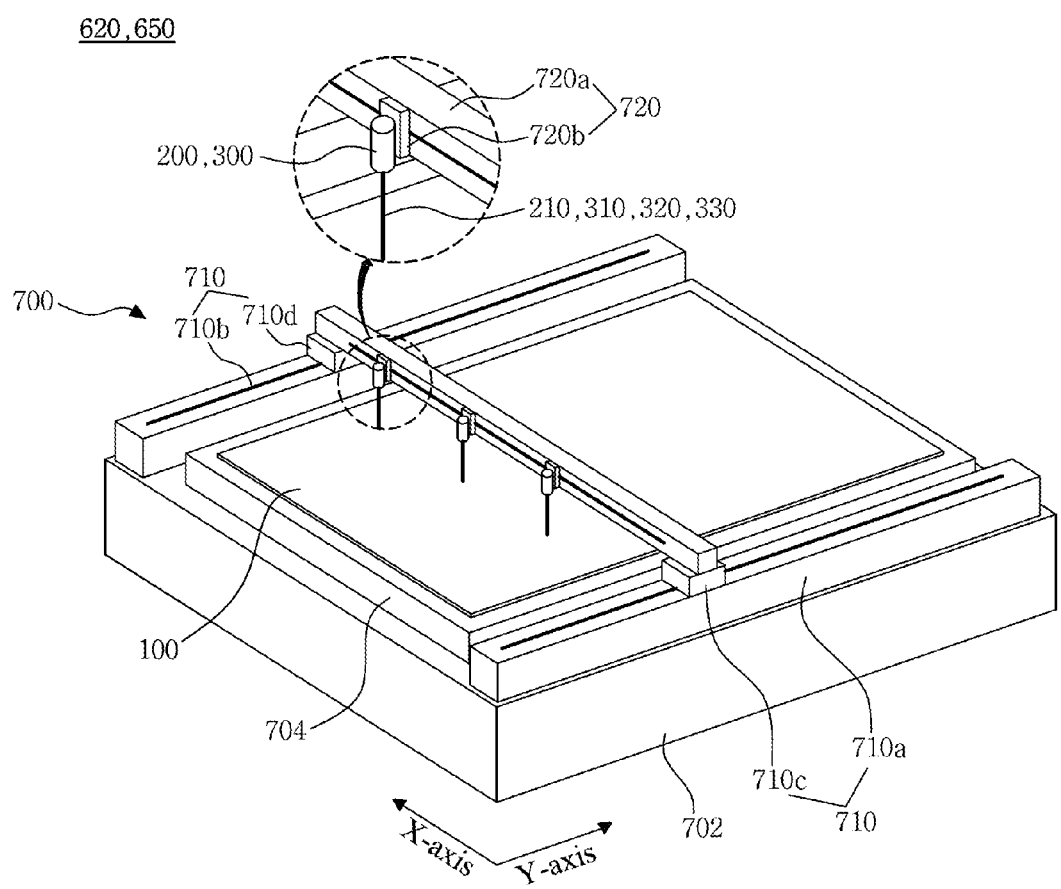
FIG. 11 is a perspective view illustrating first and second laser processing parts, shown in FIG. 9, according to the second embodiment of the present invention.

As shown in FIG. 11, the first laser irradiation processing part 620 according to the second embodiment of the present invention includes the plurality of second gantries 720 provided in the gantry 700, to thereby enable the more-reduced fabrication time.

Figure 12:
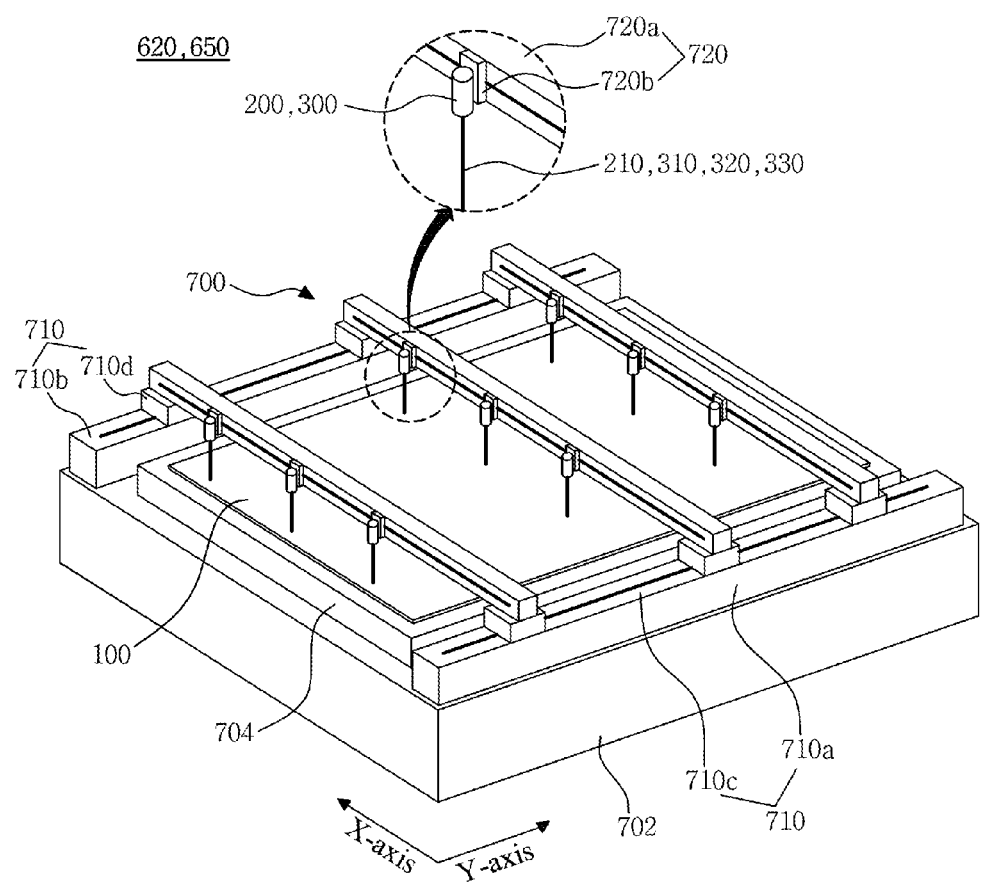
FIG. 12 is a perspective view illustrating first and second laser processing parts, shown in FIG. 9, according to the third embodiment of the present invention.

As shown in FIG. 12, the first laser irradiation processing part 620 according to the third embodiment of the present invention includes the plurality of first laser irradiation apparatuses 200 moved in the X-axis and Y-axis directions, to thereby enable the more-reduced fabrication time.

In FIG. 9, the passivation layer forming part 630 forms the passivation layer 170 on the entire surface of the substrate 100 from which the predetermined portion of the ohmic contact layer pattern 140 is removed as shown in FIG. 6G.

The conductive layer forming part 640 forms a conductive layer including the pixel electrode pattern 182, the gate pad pattern 184, and the data pad pattern 186 which are provided at fixed intervals on the passivation layer 170 as shown in FIG. 6H.

The second laser irradiation processing part 650 performs the first electrical-connection process for electrically connecting the source electrode pattern 160 with the pixel electrode pattern 182 by using the second laser 310; the second electrical-connection process for electrically connecting the gate pad electrode pattern 112 with the gate pad pattern 184 by using the third laser 320; and the third electrical-connection process for electrically connecting the data pad electrode pattern 152 with the data pad pattern 186 by using the fourth laser 330, as shown in FIGS. 6I to 6K.

For this, the second laser irradiation processing part 650 according to one embodiment of the present invention sequentially performs the first to third electrical-connection processes shown in FIGS. 6I to 6K by using the second, third, and fourth laser respectively emitted from at least one second laser irradiation apparatus 300 installed in the gantry 700 as shown in any one of FIGS. 10 to 12.

Figure 13:
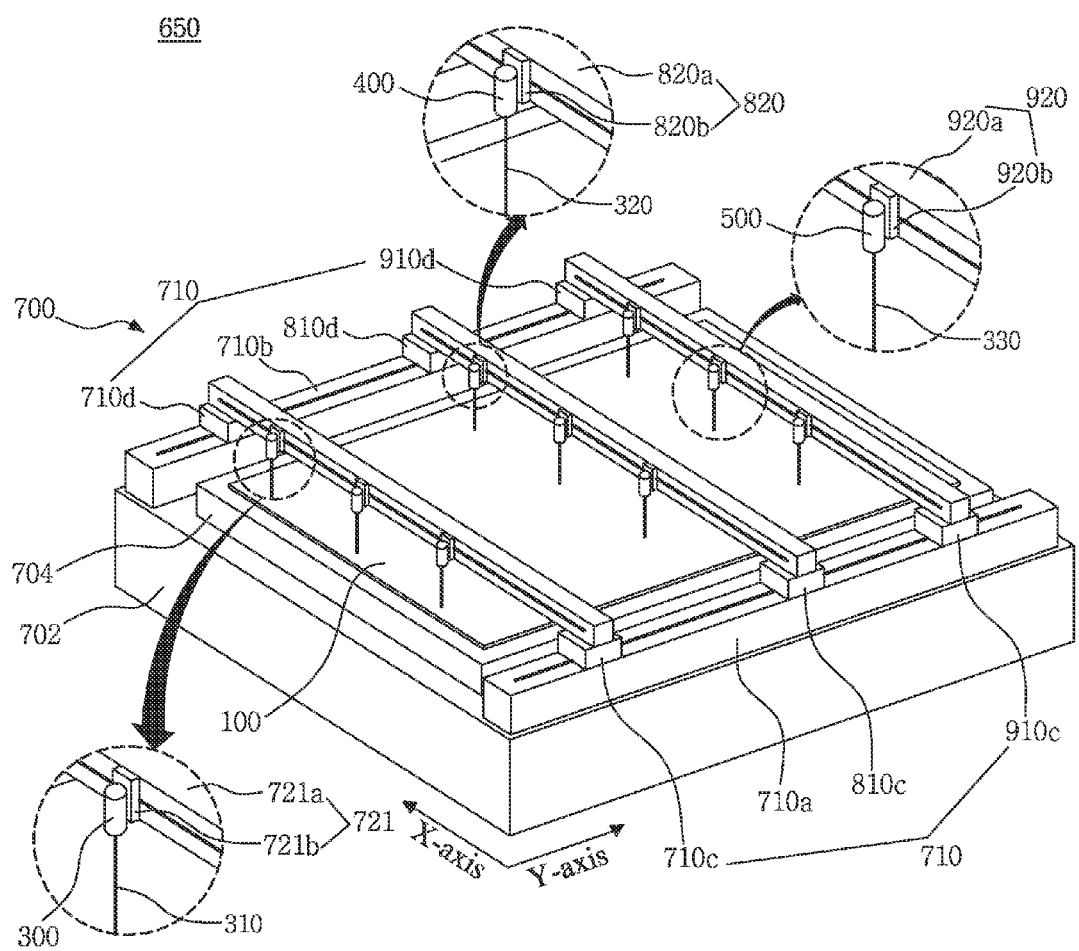
FIG. 13 is a perspective view illustrating second laser processing parts, shown in FIG. 9, according to the embodiment of the present invention.

As shown in FIG. 13, the second laser irradiation processing part 650 according to another embodiment of the present invention includes a base frame 702; a stage 704; a gantry 700; and second to fourth laser irradiation apparatuses 300, 400, and 500.

The base frame 702 supports the stage 704. Inside the base frame 702, there may be a driving/controlling apparatus (not shown) which drives and controls the stage 704, the gantry 700, and the second to fourth laser irradiation apparatus 300, 400, and 500, respectively.

The substrate 100 is transferred by an external substrate-transfer (not shown), and the transferred substrate 100 is loaded on the stage 704. At this time, the substrate-transfer loads the substrate 100, which completes cleaning and drying processes after forming the conductive layer on the passivation layer 170 by the aforementioned steps of FIGS. 6A to 6H, onto the stage 704.

In the meantime, the stage 704 may include an additionally-provided lift pin (not shown) for loading or unloading the substrate 100, and also include a plurality of vacuum pads (not shown) for a vacuum suction of the loaded substrate 100. Also, the stage 704 may be moved in the X-axis and Y-axis directions by the driving/controlling apparatus (not shown).

The gantry 700 comprises a first gantry 710 installed on the base frame 702; a second gantry 721, installed in the first gantry 710, for moving the plurality of second laser irradiation apparatuses 300 in the X-axis direction; a third gantry 820, installed in the first gantry 710, for moving the plurality of third laser irradiation apparatuses 400 in the X-axis direction; and a fourth gantry 920, installed in the first gantry 710, for moving the plurality of fourth laser irradiation apparatuses 500 in the X-axis direction.

The first gantry 710 moves the respective second, third, and fourth gantries 721, 820, and 920 in the Y-axis direction through the use of LM guide or linear motor. For this, the first gantry 710 may comprise a pair of first guiders 710a and 710b respectively installed in parallel at both edges of the base frame 702; and respective pairs of first to third sliders 710c/710d, 810c/810d, and 910c/910d respectively in the pair of first guiders 710a and 710b, wherein each pair of the first to third sliders are provided at fixed intervals.

The second gantry 721 moves in the Y-axis direction according to the operation of the first gantry 710, and also moves the plurality of second laser irradiation apparatuses 300 in the X-axis direction through the use of LM guide or linear motor. For this, the second gantry 721 may comprise a second guider 721a installed between the pair of first sliders 710c and 710d; and a plurality of fourth sliders 721b installed at fixed intervals in the second guider 721a.

The plurality of second laser irradiation apparatuses 300 are respectively installed in the plurality of fourth sliders 721b. Thus, the plurality of second laser irradiation apparatuses 300 move in the Y-axis direction according as the pair of first sliders 710c and 710d are moved by the operation of the first gantry 710; and also move in the X-axis direction according as the fourth slider 721b is moved by the operation of the second gantry 721. As the plurality of second laser irradiation apparatuses 300 are moved in the X-axis and Y-axis directions while being maintained at fixed intervals, the plurality of second laser irradiation apparatuses 300 apply the second laser 310 to the divided-regions of the substrate 100, to thereby perform the first electrical-connection process. At this time, the substrate 100 may be divided into at least nine regions according to the number of second to fourth laser irradiation apparatuses 300, 400, and 500. Accordingly, the plurality of second laser irradiation apparatuses 300 can perform the aforementioned first electrical-connection process by irradiating the corresponding divided-regions of the substrate 100 with the second laser 310.

The third gantry 820 moves in the Y-axis direction according to the operation of the first gantry 170; and also moves the plurality of third laser irradiation apparatuses 400 in the X-axis direction through the use of LM guide or linear motor. For this, the third gantry 820 may comprise a third guider 820a installed between the pair of second sliders 810c and 810d; and a plurality of fifth sliders 820b provided at fixed intervals in the third guides 820a.

The plurality of third laser irradiation apparatuses 400 are respectively installed in the plurality of fifth sliders 820b. The plurality of third laser irradiation apparatuses 400 move in the Y-axis direction according as the pair of second sliders 810c and 810d are moved by the operation of the first gantry 710; and also move in the X-axis direction according as the fifth slider 820b is moved by the operation of the third gantry 820. Accordingly, the plurality of third laser irradiation apparatuses 400 can perform the aforementioned second electrical-connection process by irradiating the corresponding divided-regions of the substrate 100 with the third laser 320.

The fourth gantry 920 moves in the Y-axis direction according to the operation of the first gantry 710, and also moves the plurality of fourth laser irradiation apparatuses 500 in the X-axis direction through the use of LM guide or linear motor. For this, the fourth gantry 920 may comprise a fourth guider 920a installed between the pair of the third sliders 910c and 910d; and a plurality of sixth sliders 920b provided at fixed intervals in the fourth guider 920a.

The plurality of fourth laser irradiation apparatuses 500 are respectively installed in the plurality of sixth sliders 920b. The plurality of fourth laser irradiation apparatuses 500 move in the Y-axis direction according as the pair of third sliders 910c and 910d are moved by the operation of the first gantry 710; and also move in the X-axis direction according as the sixth slider 920b is moved by the operation of the fourth gantry 920. Accordingly, the plurality of fourth laser irradiation apparatuses 500 can perform the aforementioned third electrical-connection process by irradiating the corresponding divided-regions of the substrate 100 with the fourth laser 330.

In the meantime, since the second, third, and fourth gantries 721, 820, and 920 are installed in the first gantry 710, a mutual-interference may occur. Accordingly, the first to third electrical-connection processes can be simultaneously performed in the corresponding divided-region of the substrate 100 without the mutual-interference when moving the second, third and fourth gantries 721, 820, and 920. In case of the corresponding divided-region of the substrate 100 with the mutual-interference when moving the second, third and fourth gantries 721, 820, and 920, at least two of the first to third electrical-connection processes may be performed simultaneously or sequentially.

The aforementioned second laser irradiation processing part 650 according to the embodiment of the present invention discloses the plurality of laser irradiation apparatuses 300, 400, and 500 provided movably. However, it is not limited to this structure. For example, only the stage 704 may be moved under such circumstance that the plurality of laser irradiation apparatuses 300, 400, and 500 are provided fixedly; or the plurality of laser irradiation apparatuses 300, 400, and 500 and the stage 704 may be moved simultaneously.

The apparatus of fabricating TFT according to the embodiment of the present invention applies the laser 210, 310, 320, and 330 to the substrate 100 while the plurality of laser irradiation apparatuses 200 are moved through the use of gantry 700, which enables to simultaneously or sequentially perform the process of patterning the ohmic contact layer pattern and the first to third electrical-connection processes, to thereby prevent the semiconductor layer pattern from being damaged and to enable the more-reduced fabrication time.

FIGS. 14A to 14I are perspective views explaining a method of patterning a thin film for forming a TFT according to the embodiment of the present invention.

Figure 14A:
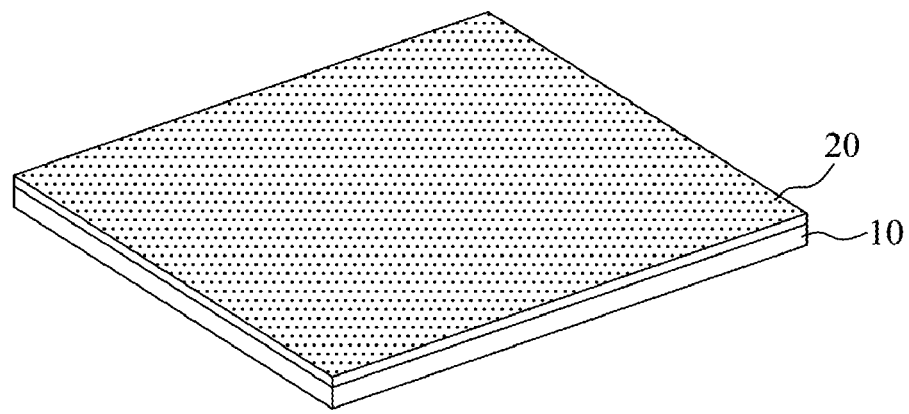
FIGS. 14A to 14I are perspective views illustrating a method of patterning a thin film according to the embodiment of the present invention.

As shown in FIG. 14A, a thin film 20 is formed on an entire surface of a substrate 10. At this time, the substrate 10 may be made of a transparent material, for example, glass or plastic such as PET (Polyethylene Terephthalate), PEN (Polyethylenenaphthelate), PP (Polypropylene), PI (Polyamide) or TAC (Tri Acetyl Cellulose). Preferably, the substrate 10 is made of glass, but not necessarily. The thin film 20 may be any one of materials used for fabricating the TFT.

Figure 14B:
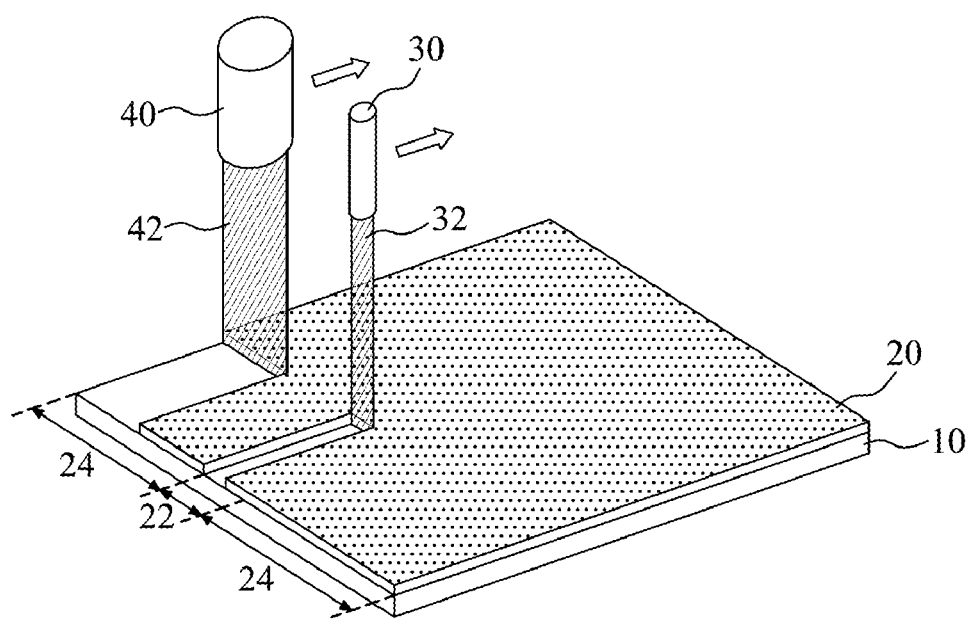

As shown in FIG. 14B, a thin film pattern is formed on the substrate 10 by using a first laser irradiation apparatus 30, and simultaneously the thin film 20 except the thin film pattern to be formed is removed from the substrate 10 by using a second laser irradiation apparatus 40. That is, while the first and second laser irradiation apparatuses 30 and 40 are moved from one side of the substrate 10 to the other side of the substrate 10, first and second laser 32 and 42, respectively emitted from the first and second laser irradiation apparatuses 30 and 40, are directly applied to the thin film 20. At this time, the first and second laser 32 and 42 may use YLF laser which includes Nd3+ in addition to YLiF4 (YLF) crystal using a solid-phase material as a medium; Nd:YAG laser having infrared wavelength of 1064 nm; or H-F laser corresponding to Excimer laser using a gaseous medium. Without being limited to the aforementioned kind and intensity of the laser, the kind of applied laser or the intensity of the laser per unit area may be changed based on the kind of the thin film 20. Also, the first and second laser irradiation apparatuses 30 and 40 are moved at the same speed in the same direction.

In more detail, the first laser irradiation apparatus 30 directly applies the first laser 32 with a first width to a first region 22 to be provided with the thin film pattern on the substrate 10, whereby the thin film pattern is formed by partially removing the thin film 20 from the first region 22 on the substrate 10. At this time, if the thin film 20 is formed on another lower thin film (not shown), the first laser irradiation apparatus 30 may apply the first laser 32, whose power is gradually decreased as approaching to the lower thin film, to the thin film 20 several times so as to prevent the lower thin film from being damaged, whereby the thin film 20 may be removed without the damage to the lower thin film.

Also, the second laser irradiation apparatus 40 directly applies the second laser 42 with a second width to a second region 24 not to be provided with the thin film pattern on the substrate 10, wherein the second width is wider than the first width, to thereby partially remove the thin film 20 from the second region 24 on the substrate. At this time, if the thin film 20 is formed on another lower thin film (not shown), the second laser irradiation apparatus 40 may apply the second laser 42, whose power is gradually decreased as approaching to the lower thin film, to the thin film 20 several times so as to prevent the lower thin film from being damaged, whereby the thin film 20 may be removed without the damage to the lower thin film.

Figure 14C:
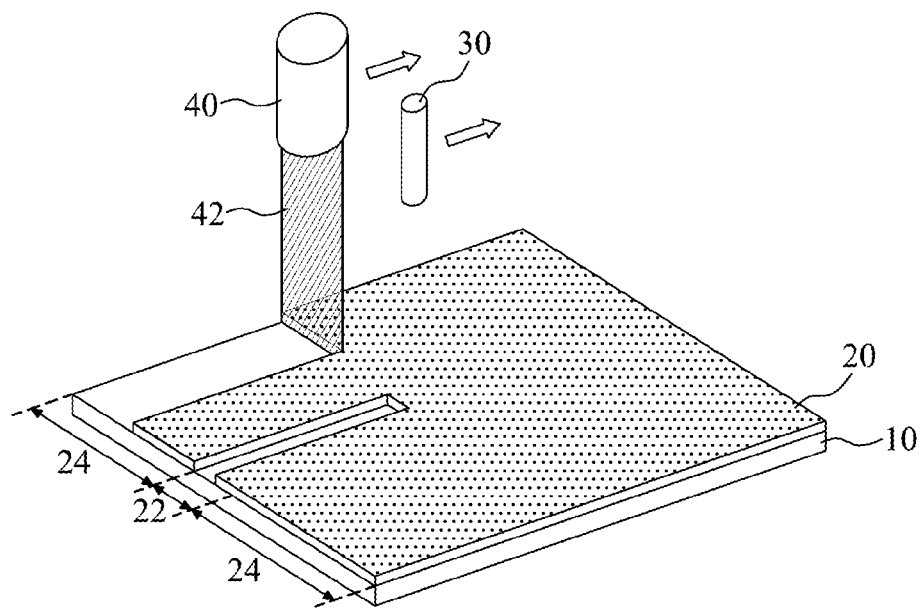
Figure 14D:
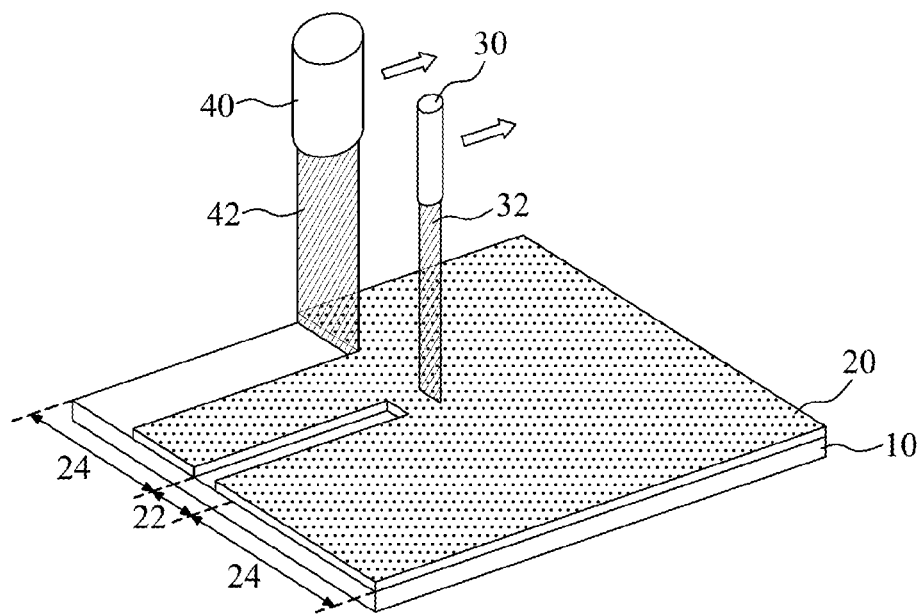
Figure 14E:
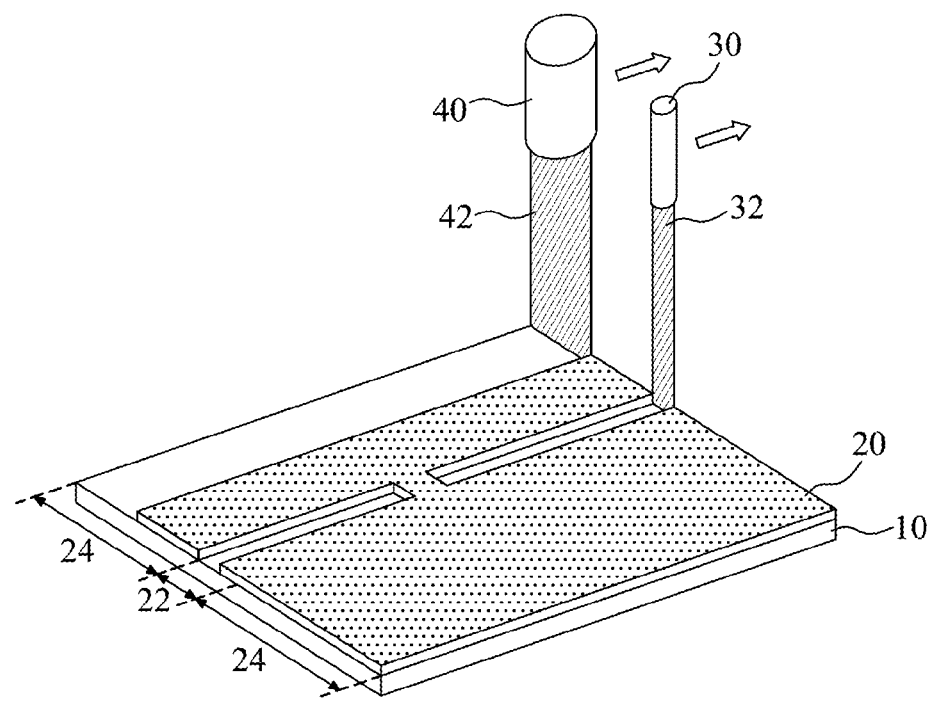

When the first laser irradiation apparatus 30 is positioned above a region corresponding to a shape of the thin film pattern, as shown in FIG. 14C, the first laser irradiation apparatus 30 is moved without applying the first laser 32 thereto. After that, the first laser irradiation apparatus 30 starts to apply the first laser 32 when approaching to a region which is not corresponding to the shape of the thin film pattern, to thereby remove the thin film 20 from the substrate 10.

Figure 14F:
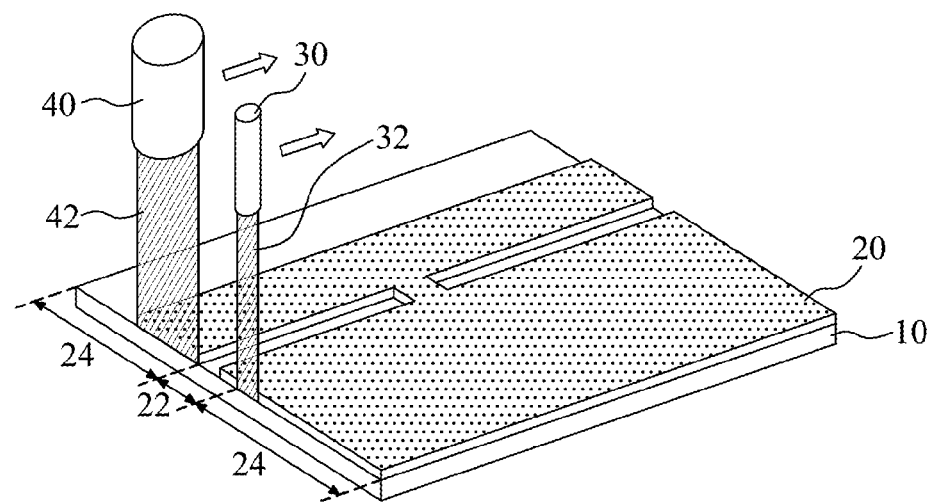

After completing the removal of the thin film 20 at the first direction of the substrate 10, the first and second laser irradiation apparatuses 30 and 40 are restored to their original positions corresponding to one side of the substrate 10, as shown in FIG. 14F.

Then, as shown in FIG. 14F, the first laser irradiation apparatus 30 is moved to the second direction perpendicular to the first direction so as to be in correspondence with the shape of the thin film pattern, and simultaneously the second laser irradiation apparatus 40 is moved from its former position toward the second direction by the second width.

Figure 14G:
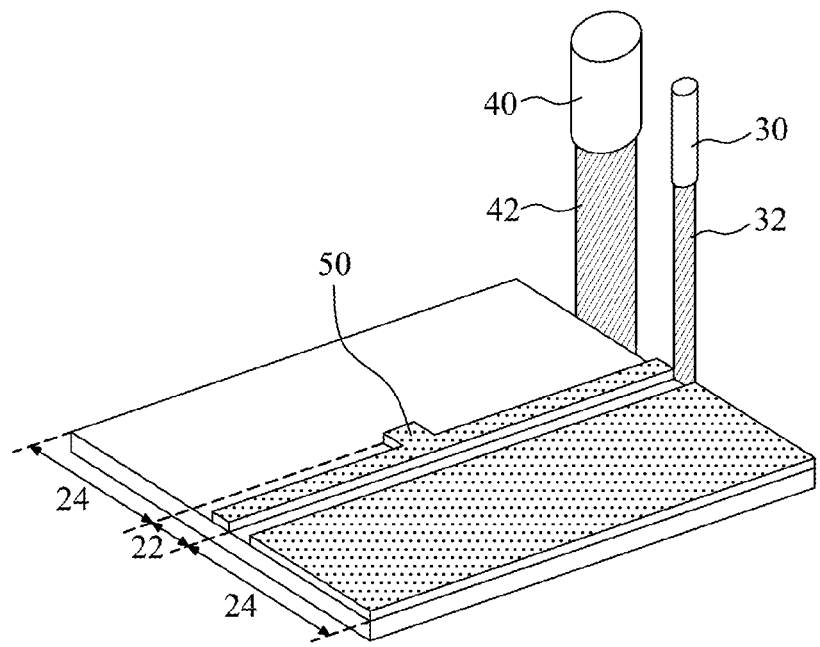

As shown in FIG. 14G, the first and second laser irradiation apparatuses 30 and 40 remove the thin film 20 by directly applying the first and second laser 32 and 42 to the thin film 20 while being moved from one side of the substrate 10 to the other side of the substrate 10, thereby forming a thin film pattern 50 in the first region of the substrate 10.

Figure 14H:
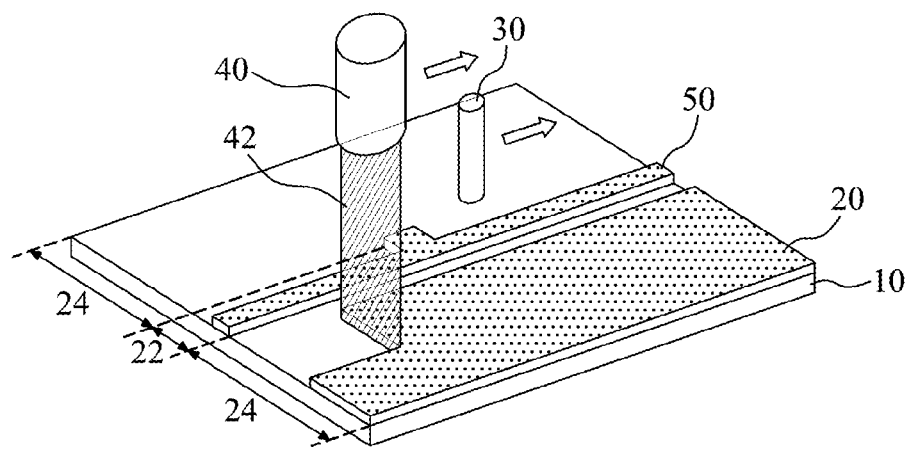

When the thin film pattern 50 is formed on the substrate 10 by the first laser 32 emitted from the first laser irradiation apparatus 30, as shown in FIG. 14H, the second laser irradiation apparatus 40 removes the remaining thin film 20 from the second region 24 on the substrate 10 by applying the second laser 42 thereto. At this time, the first laser irradiation apparatus 30 is moved without applying the first laser 32 to the thin film 20 remaining in the second region 24 of the substrate 10.

Since the first and second laser irradiation apparatuses 30 and 40 are maintained at a fixed interval therebetween, the first laser irradiation apparatus 30 as well as the second laser irradiation apparatus 40 can remove the thin film 20 from the second region 24 according to the size of the thin film 20 remaining on the substrate 10.

Figure 14I:
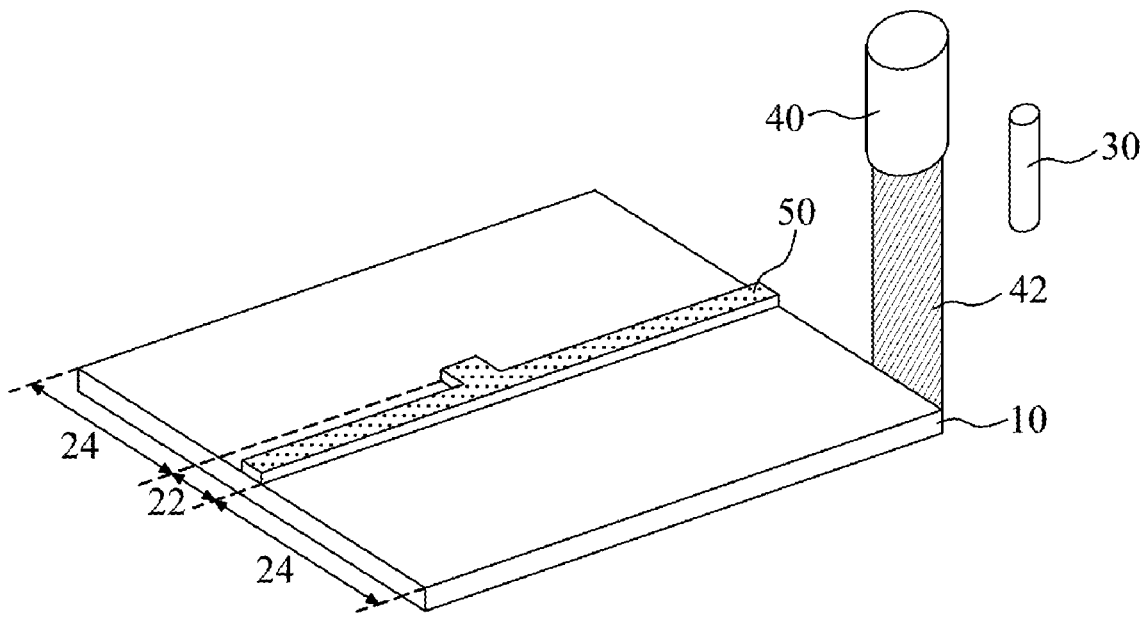

The method of patterning the thin film for forming the TFT according to the embodiment of the present invention repetitively moves the first and second laser irradiation apparatus 30 and 40 which respectively emit the first and second laser whose widths are different from each other, whereby the predetermined thin film pattern 50 is formed on the substrate 10 as shown in FIG. 14I.

The method of patterning the thin film for forming the TFT according to the embodiment of the present invention can form the thin film pattern 50 on the substrate 10 by removing the thin film 20 from the substrate 10 through the use of first and second laser irradiation apparatuses 30 and 40 respectively emitting the laser 32 and 42 having the different widths, to thereby simplify the thin film patterning process and reduce the patterning time.

This method of patterning the thin film can be applied to form at least any one of gate electrode, semiconductor layer, source and drain electrodes, and pixel electrode during the aforementioned method of fabricating TFT according to the present invention.

Figure 15:
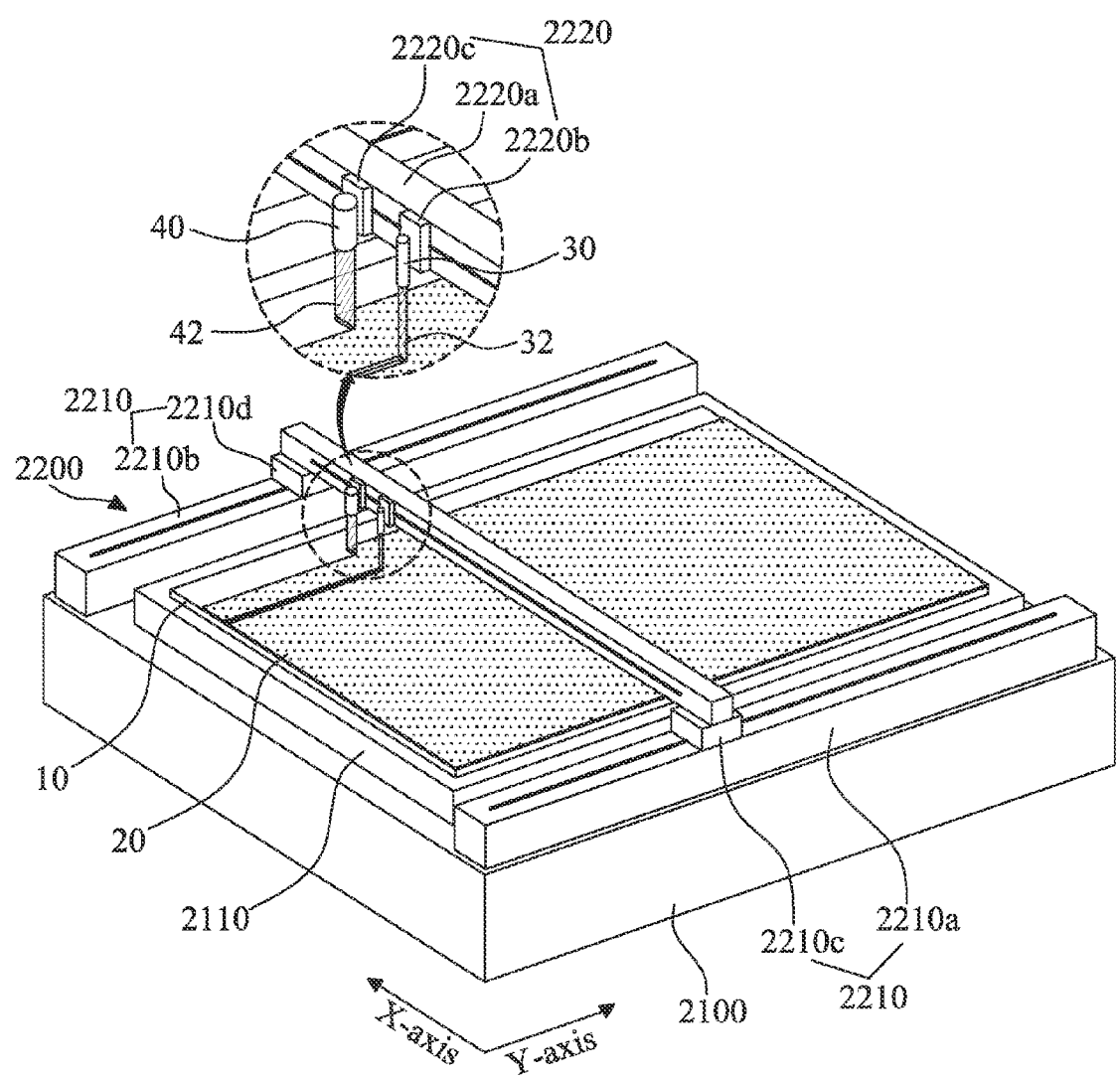
FIG. 15 is a perspective view illustrating an apparatus of patterning a thin film according to the embodiment of the present invention.

FIG. 15 is a perspective view explaining a thin film patterning apparatus for forming TFT according to the first embodiment of the present invention.

Referring to FIG. 15, the thin film patterning apparatus according to the first embodiment of the present invention includes a base frame 2100, a stage 2110, a gantry 2200, and the first and second laser irradiation apparatuses 30 and 40.

The base frame 2100 supports the stage 2110. Inside the base frame 2100, there may be a driving/controlling apparatus (not shown) which drives and controls the stage 2110, the gantry 2200, and the first and second laser irradiation apparatuses 30 and 40, respectively.

The substrate 10 is transferred by an external substrate-transfer (not shown), and the transferred substrate 10 is loaded on the stage 2110. At this time, the thin film 20 made of any one of materials used for fabricating the TFT is formed on the substrate 10.

The stage 2110 may include an additionally-provided lift pin (not shown) for loading or unloading the substrate 10, and also include a plurality of vacuum pads (not shown) for a vacuum suction of the loaded substrate 10. Also, the stage 2110 may be moved in the X-axis and Y-axis directions by the driving/controlling apparatus (not shown).

The gantry 2200 comprises a first gantry 2210 installed on the base frame 2100; and a second gantry 2220, installed in the first gantry 2210, for moving the first and second laser irradiation apparatuses 30 and 40 in the X-axis direction.

The first gantry 2210 moves the second gantry 2220 in the Y-axis direction through the use of LM guide or linear motor. For this, the first gantry 2210 may comprise a pair of first guiders 2210a and 2210b and a pair of first sliders 2210c and 2210d, wherein the pair of first guiders 2210a and 2210b are respectively installed in parallel at both edges of the base frame 2100, and the pair of first sliders 2210c and 2210d are respectively installed in the first guiders 2210a and 2210b.

The second gantry 2220 moves in the Y-axis direction according to the operation of the first gantry 2210, and also moves the first and second laser irradiation apparatuses 30 and 40 in the X-axis direction through the use of LM guide or linear motor. For this, the second gantry 2220 may comprise a second guider 2220a connected between the pair of first sliders 2210c and 2210d of the first gantry 2210; a second slider 2220b installed in the second guides 2220a; and a third slider 2220c installed in the second guider 2220a and provided at a predetermined interval from the second slider 2220b. At this time, the interval between the second and third sliders 2220b and 2220c may be determined based on the shape of the thin film pattern to be formed on the substrate 10.

The gantry 2200 moves the first and second laser irradiation apparatuses 30 and 40 at the same speed in the same direction.

The first laser irradiation apparatus 30 is installed in the second slider 2220b. The first laser irradiation apparatus 30 is moved in the Y-axis direction according as the pair of first sliders 2210c and 2210d are moved by the operation of the first gantry 2210, and the first laser irradiation apparatus 30 is also moved in the X-axis direction according as the second slider 2220b is moved by the operation of the second gantry 2220. While the first laser irradiation apparatus 30 is moved in the X-axis and Y-axis directions by the operation of the gantry 2200, the first laser irradiation apparatus 30 directly applies the first laser 32 with the first width to the thin film 20 of the substrate 10, thereby forming the thin film pattern 50 on the substrate 10 by removing the thin film 20 from the first region 22 to be provided with the thin film pattern on the substrate 10, as shown in FIGS. 14B to 14G.

The first laser irradiation apparatus 30 applies the first laser 32 to the thin film 20 once, to thereby remove the thin film 20 by the first width. At this time, if the thin film 20 is formed on another lower thin film (not shown), the first laser irradiation apparatus 30 may apply the first laser 32, whose power is gradually decreased as approaching to the lower thin film, to the thin film 20 several times so as to prevent the lower thin film from being damaged, whereby the thin film 20 may be removed without the damage to the lower thin film.

The second laser irradiation apparatus 40 is installed in the third slider 2220c. The second laser irradiation apparatus 40 is moved in the Y-axis direction according as the pair of first sliders 2210c and 2210d are moved by the operation of the first gantry 2210. Simultaneously with the first laser irradiation apparatus 30, the second laser irradiation apparatus 40 is moved in the X-axis direction according as the third slider 2220c is moved by the operation of the second gantry 2220. Also, the second laser irradiation apparatus 40 directly applies the second laser 42 with the second width to the second region 24 not to be provided with the thin film pattern on the substrate 10 while being moved in the X-axis and Y-axis direction according to the operation of the gantry 2200, to thereby remove the thin film 20 from the second region 24 of the substrate 10, as shown in FIGS. 14A to 14I.

The second laser irradiation apparatus 40 applies the second laser 42 to the thin film 20 once, to thereby remove the thin film 20 by the second width. At this time, if the thin film 20 is formed on another lower thin film (not shown), the second laser irradiation apparatus 40 may apply the second laser 42, whose power is gradually decreased as approaching to the lower thin film, to the thin film 20 several times so as to prevent the lower thin film from being damaged, whereby the thin film 20 may be removed without the damage to the lower thin film.

The aforementioned thin film patterning apparatus according to the first embodiment of the present invention discloses the first and second laser irradiation apparatuses 30 and 40 provided movably, however, it is not limited to this structure. Selectively, only the stage 2110 can be moved under such circumstance that the first and second laser irradiation apparatuses 30 and 40 are provided fixedly. Furthermore, the first and second laser irradiation apparatuses 30 and 40 and the stage 2110 may be moved at the same time.

In case of the thin film patterning apparatus according to the first embodiment of the present invention, the first and second laser irradiation apparatuses 30 and 40 respectively apply the first and second laser 32 and 42 with the different widths to the thin film 20 of the substrate 10 while being moved through the use of gantry 2200, whereby it is possible to simplify the pattering process and to reduce the fabrication time.

Figure 16:
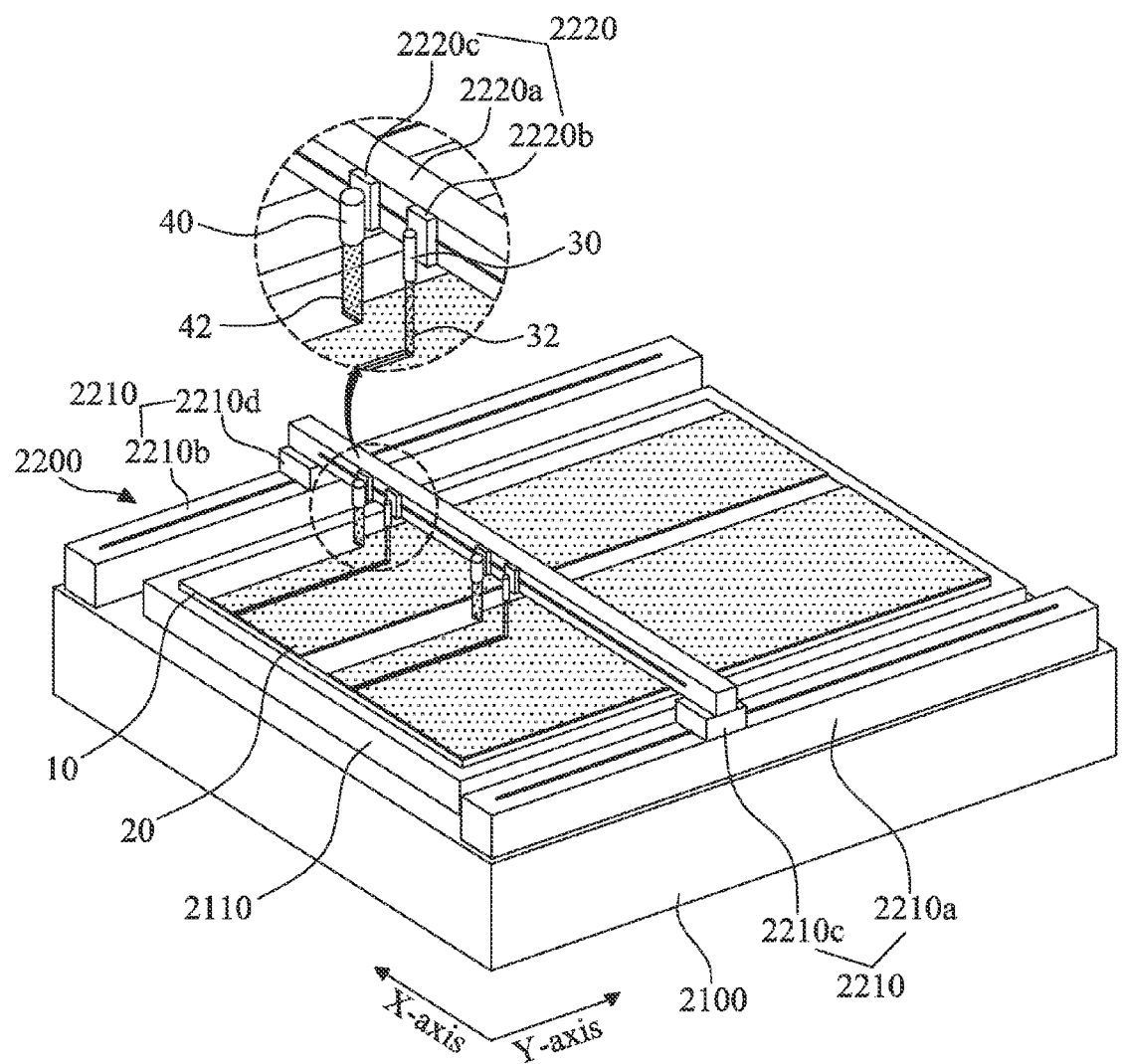
FIG. 16 is a perspective view illustrating an apparatus of pattering a thin film according to another embodiment of the present invention.

In case of the thin film patterning apparatus according to the second embodiment of the present invention, as shown in FIG. 16, the plurality of first and second laser irradiation apparatuses 30 and 40 are provided at fixed intervals in the second gantry 2220 of the gantry 2200, thereby enabling the more-reduced fabrication time. In this case, the substrate 10 is divided into two regions, and the plurality of first and second laser irradiation apparatuses 30 and 40 are positioned above each of the respective two regions, so that it is possible to enable the more-reduced fabrication time.

Figure 17:
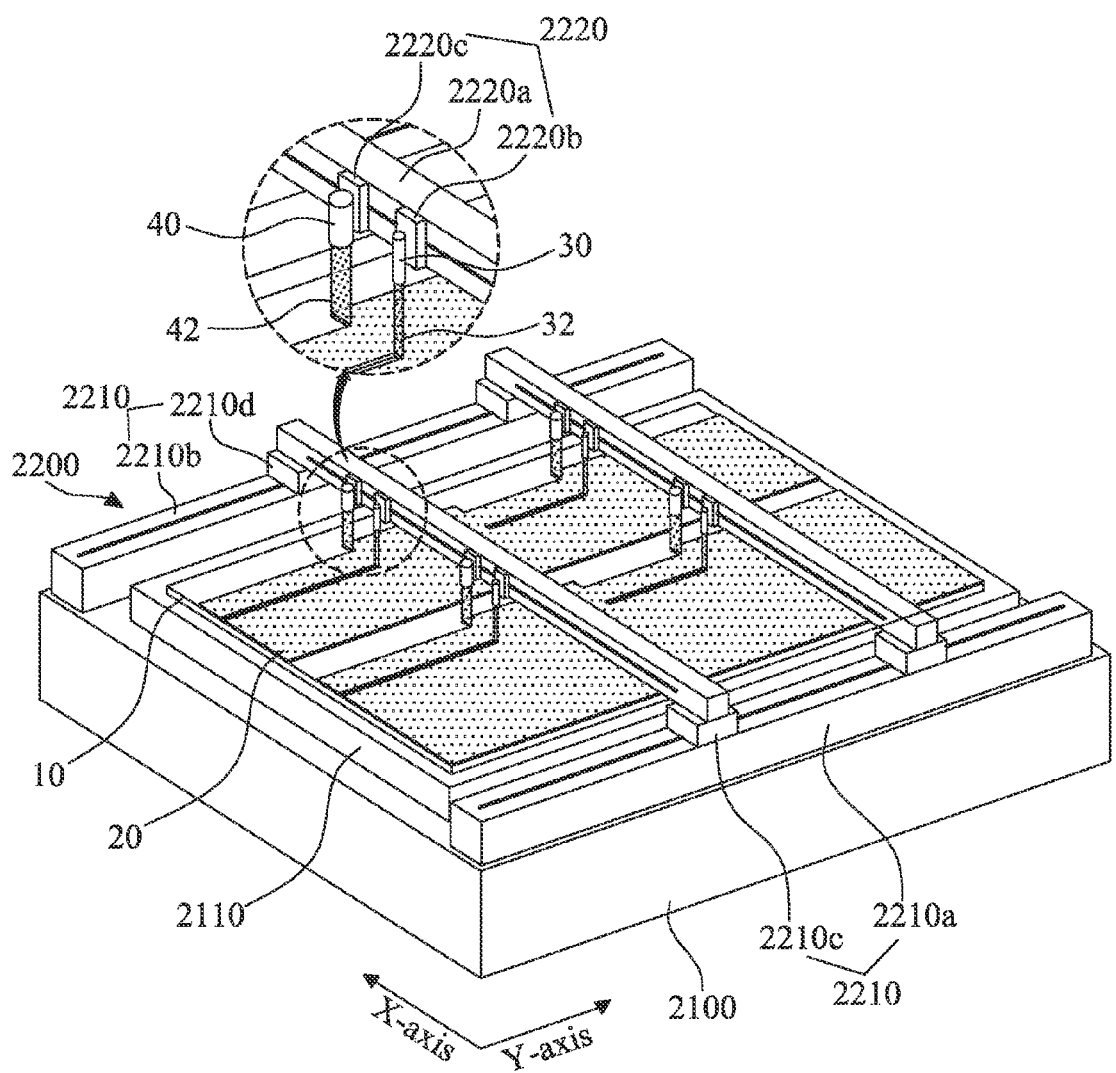
FIG. 17 is a perspective view illustrating an apparatus of patterning a thin film according to another embodiment of the present invention.

In case of the thin film patterning apparatus according to the third embodiment of the present invention, as shown in FIG. 17, in order to reduce the fabrication time, the plurality of second gantries 2220 may be provided at fixed intervals in the first gantry 2210, and the plurality of first and second laser irradiation apparatus 30 and 40 are provided at fixed intervals in the respective second gantries 2220. In this case, the substrate 10 may be divided into at least four regions, and each region may be provided with the first and second laser irradiation apparatuses 30 and 40, to thereby enable the more-reduced fabrication time.

Accordingly, the method and apparatus of fabricating TFT according to the present invention has the following advantages.

The ohmic contact layer exposed between the source and drain electrodes is removed by using the laser, so that it is possible to prevent the semiconductor layer from being damaged, and to enable the more-reduced fabrication time.

Also, the yield of TFT fabrication can be improved by preventing the semiconductor layer from being damaged.

The respective electrical-connection processes for electrically connecting the source electrode pattern with the pixel electrode pattern, connecting the gate pad electrode pattern with the gate pad pattern, and connecting the data pad electrode pattern with the data pad pattern can be performed by using the plurality of laser irradiation apparatuses, whereby the fabrication time can be reduced.

The thin film pattern is formed on the substrate by patterning the thin film on the substrate through the use of laser irradiation apparatus, thereby simplifying the thin film patterning process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A method of fabricating a TFT comprising:
forming a gate electrode pattern on a substrate;
forming a gate insulating layer on the gate electrode pattern;
sequentially forming a semiconductor layer pattern and an ohmic contact layer pattern on the gate insulating layer;

forming source and drain electrode patterns on the ohmic contact layer pattern, wherein the source and drain electrode patterns are provided at a fixed interval therebetween; and removing the ohmic contact layer pattern exposed between the source and drain electrode patterns by applying laser radiation with a gradually-decreased laser power to the ohmic contact layer pattern exposed between the source and drain electrode patterns.

2. The method of claim 1, wherein the process of forming the gate electrode pattern comprises:

forming a gate electrode material on an entire surface of the substrate; and forming a predetermined gate electrode pattern by removing a predetermined portion of the gate electrode material using laser radiation.

3. The method of claim 1, wherein the process of forming the semiconductor layer pattern and the ohmic contact layer pattern comprises:

sequentially forming a semiconductor layer material and an ohmic contact layer material on an entire surface of the gate insulating layer; and forming a predetermined semiconductor layer pattern and a predetermined ohmic contact layer pattern by removing predetermined portions of the semiconductor layer material and ohmic contact layer material using laser irradiation.

4. The method of claim 1, wherein the process of forming the source and drain electrode patterns comprises:

forming source and drain electrode materials on the entire surface of the substrate including the ohmic contact layer pattern; and forming a source electrode pattern and a drain electrode pattern by removing predetermined portions of the source and drain electrode materials using laser irradiation.

5. The method of claim 1, further comprising:

forming a passivation layer on the entire surface of the substrate including the source and drain electrode patterns; and forming a pixel electrode pattern electrically connected with the source electrode pattern.

6. The method of claim 5, wherein the process of forming the passivation layer comprises a step of forming a contact hole in the passivation layer so as to electrically connect the pixel electrode pattern with the source electrode pattern; and wherein the process of forming the pixel electrode pattern comprises steps of forming a pixel electrode material on the entire surface of the substrate including the passivation layer with the contact hole, and forming a predetermined pixel electrode pattern by removing a predetermined portion of the pixel electrode material using laser irradiation.

7. The method of claim 5, wherein the process of forming the pixel electrode pattern comprises:

forming a pixel electrode pattern on the passivation layer; and applying laser to the pixel electrode pattern so as to electrically connect the pixel electrode pattern with the source electrode pattern.

8. The method of claim 1, wherein forming the source and drain electrode patterns comprises a printing process.

9. The method of claim 1, wherein the laser radiation is generated using a neodymium-doped yttrium lithium fluoride laser.

10. The method of claim 1, wherein the laser radiation is generated using a neodymium-doped yttrium aluminum garnet laser.

11. The method of claim 10, wherein the laser has an infrared wavelength of about 1064 nm.

12. The method of claim 1, wherein the laser radiation is generated using an Excimer laser and a gaseous medium.

13. A method of fabricating TFT comprising:

forming a gate electrode pattern on a substrate;

forming a gate insulating layer on the gate electrode pattern;

forming a semiconductor layer pattern on the gate insulating layer;

forming source and drain electrode patterns on the semiconductor layer pattern, wherein the source and drain electrode patterns are at a fixed interval therebetween;

forming a passivation layer on the source and drain electrode patterns; and forming a pixel electrode pattern electrically connected with the source electrode pattern, wherein at least one of the aforementioned processes for forming the gate electrode pattern, the semiconductor layer pattern, the source and drain electrode patterns, and the pixel electrode pattern comprises forming a corresponding material on an entire surface of the substrate, and removing a predetermined portion of the corresponding material from the substrate by irradiation with a laser, and removing the predetermined portion of the corresponding material comprises removing the corresponding material from a first region of the substrate using a first laser with a first width, and simultaneously removing the corresponding material from a second region other than the first region of the substrate using a second laser with a second width, the second width being wider than the first width.

14. The method of claim 13, further comprising:

forming a gate pad electrode pattern simultaneously with the gate electrode pattern;

forming a data pad electrode pattern simultaneously with the source and drain electrode patterns; and forming gate and data pad patterns simultaneously with the pixel electrode pattern.

15. The method of claim 14, wherein the process of forming the pixel electrode pattern, the gate pad electrode pattern, and the data pad electrode pattern comprises:

forming a pixel electrode pattern, a gate pad pattern, and a data pad pattern on the passivation layer;

performing a first electrical-connection process for electrically connecting the pixel electrode pattern with the source electrode pattern by applying laser radiation to the pixel electrode pattern;

performing a second electrical-connection process for electrically connecting the gate pad electrode pattern with the gate pad pattern by applying laser radiation to the gate pad pattern; and performing a third electrical-connection process for electrically connecting the data pad electrode pattern with the data pad pattern by applying laser radiation to the data pad pattern.

16. The method of claim 15, wherein at least two of the first electrical-connection process, the second electrical-connection process, and the third electrical-connection process are performed at the same time.

17. The method of claim 13, wherein the process of forming the pixel electrode pattern comprises:
- forming a pixel electrode pattern on the passivation layer; and
- irradiating the pixel electrode pattern with a laser so as to electrically connect the pixel electrode pattern with the source electrode pattern.

18. A method of fabricating a TFT comprising:
- simultaneously forming a gate electrode pattern and a gate pad electrode pattern on a substrate;
- forming a gate insulating layer on the gate electrode pattern;
- forming a semiconductor layer pattern on the gate insulating layer;
- simultaneously forming source and drain electrode patterns and a data pad electrode pattern on the semiconductor layer pattern, wherein the source and drain electrode patterns are at a fixed interval therebetween;
- forming a passivation layer on an entire surface of the substrate including the source and drain electrode patterns;
- simultaneously forming a pixel electrode pattern and gate and data pad patterns on the passivation layer; and
- performing an electrical-connection process for electrically connecting the pixel electrode pattern with the source electrode pattern, the gate pad electrode pattern with the gate pad pattern, and the data pad electrode pattern with the data pad pattern by applying laser radiation to the pixel electrode pattern, the gate pad pattern, and the data pad pattern, respectively.

19. The method of claim 18, wherein at least one of the processes for forming the gate electrode pattern, the semiconductor layer pattern, the source and drain electrode patterns, and the pixel electrode pattern comprises removing a predetermined portion of the corresponding material from the substrate by irradiation with a laser.

20. The method of claim 19, wherein removing the predetermined portion of the corresponding material comprises removing the corresponding material from a first region of the substrate using a first laser with a first width, and simultaneously removing the corresponding material from a second region using a second laser with a second width, the second width being wider than the first width.

21. The method of claim 18, wherein the electrical-connection process comprises a first electrical-connection process that electrically connects the pixel electrode pattern with the source electrode pattern, a second electrical-connection process that electrically connects the gate pad electrode pattern with the gate pad pattern, and a third electrical-connection process that electrically connects the data pad electrode pattern with the data pad pattern.

22. The method of claim 21, wherein at least two of the first electrical-connection process, the second electrical-connection process, and the third electrical-connection process are performed at the same time.

* * * * *